United States Patent [19]

Subramanian et al.

[11] Patent Number: 5,494,837
[45] Date of Patent: Feb. 27, 1996

[54] METHOD OF FORMING SEMICONDUCTOR-ON-INSULATOR ELECTRONIC DEVICES BY GROWING MONOCRYSTALLINE SEMICONDUCTING REGIONS FROM TRENCH SIDEWALLS

[75] Inventors: Chitra K. Subramanian, Austin, Tex.; Gerold W. Neudeck, West Lafayette, Ind.

[73] Assignee: Purdue Research Foundation, West Lafayette, Ind.

[21] Appl. No.: 312,874

[22] Filed: Sep. 27, 1994

[51] Int. Cl.$^6$ ............................................. H01L 21/8232
[52] U.S. Cl. ................... 437/34; 437/41; 437/62; 437/90
[58] Field of Search ................... 437/40, 41, 62, 437/78, 89, 90, 34

[56] References Cited

U.S. PATENT DOCUMENTS

| | | | |
|---|---|---|---|
| 4,504,332 | 3/1985 | Shinada | 148/187 |
| 4,829,016 | 5/1989 | Neudeck | 437/31 |
| 4,974,045 | 11/1990 | Okita | 257/518 |
| 5,049,513 | 9/1991 | Eklund | 437/34 |
| 5,118,634 | 6/1992 | Neudeck et al. | 437/31 |
| 5,143,862 | 9/1992 | Moslehi | 437/62 |
| 5,177,582 | 1/1993 | Meister et al. | 257/588 |
| 5,212,397 | 5/1993 | See et al. | 257/347 |
| 5,258,318 | 11/1993 | Buti et al. | 437/34 |
| 5,279,978 | 1/1994 | See et al. | 437/34 |
| 5,286,996 | 2/1994 | Neudeck et al. | 257/586 |

FOREIGN PATENT DOCUMENTS 0588300  3/1994  European Pat. Off. .

OTHER PUBLICATIONS

Konaka et al., *A 20–ps Si Bipolar IC Using Advanced Super Self-Aligned Process Technology with Collector Ion Implantation*, IEEE Transactions on Electron Devices, vol. 36, No. 7, Jul. 1989, pp. 1370–1375.

J. van der Velden et al., *Basic: An Advanced High–Performance Bipolar Process*, IEEE, IEDM 89, pp. 233–236.

Wen Fang, *Accurate Analytical Delay Expressions for ECL and CML Circuits and Their Applications to Optimizing High–Speed Bipolar Circuits*, IEEE Journal of Solid–State Circuits, vol. 25, No. 2, Apr. 1990, pp. 572–583.

Subramanian et al., *Large Area Silicon on Insulator by Double–Merged Epitaxial Lateral Overgrowth*, J. Vac. Sci. Technol. B., vol. 10, No. 2, Mar./Apr. 1992, pp. 643–647.

Subramanian et al., *SOI Processing by Epitaxial Lateral Overgrowth*, IEEE, 1991, pp. 132–333.

Subramanian et al., *A Full–Wafer SOI Process for 3 Dimensional Integration*, IEEE, 1991, pp. 195–198.

(List continued on next page.)

*Primary Examiner*—Brian E. Hearn
*Assistant Examiner*—Tuan Nguyen
*Attorney, Agent, or Firm*—Bell, Seltzer, Park & Gibson

[57] ABSTRACT

A method of forming a semiconductor-on-insulator (SOI) electronic device includes the steps of etching a semiconductor substrate to form a plurality of adjacent trenches therein and then forming electrically insulating layers on bottoms of the trenches. Epitaxial lateral overgrowth (ELO) is then performed to grow respective monocrystalline semiconducting regions in the trenches. These semiconducting regions are preferably grown from a sidewall of each trench onto a respective insulating layer and fill each trench. Monocrystalline active regions of the electronic device are then formed in the semiconducting regions and also in the substrate, adjacent the trench sidewalls. For example, a monocrystalline trench isolated extrinsic base region of a bipolar junction transistor (BJT) can be formed in a semiconducting region in a respective trench, and a corresponding intrinsic base region and an intrinsic collector region can be formed in the substrate, adjacent the semiconducting region. Alternatively, trench isolated source and drain regions of a field effect transistor (FET) can be formed in one or more adjacent semiconducting regions and the corresponding channel region of the FET can be formed therebetween.

11 Claims, 16 Drawing Sheets

OTHER PUBLICATIONS

Glenn, Jr. et al., *A Fully Planar Method for Creating Adjacent "Self–Isolating" Silicon–On–Insulator and Epitaxial Layers by Epitaxial Lateral Overgrowth*, Appl. Phys. Lett., vol. 60, No. 4, Jan. 27, 1992, pp. 483–485.

Bashir et al., *A Polysilicon Contacted Subcollector BJT for a Three–Dimensional BiCMOS Process*, IEEE Electron Device Letters, vol. 13, No. 8, Aug. 1992, pp. 392–395.

Bashir et al., *Delay Time Studies and Electron Mobility Measurement in an a–Si:H TFT*, IEEE Transaction on Electron Devices, vol. 36, No. 12, Dec. 1989, pp. 2944–2948.

*A Technique to Measure the Dynamic Response of a–Si:H Thin Film Transistor Circuits*, Solid–State Electronics, vol. 33, No. 7, 1990, pp. 973–974.

Gilbert et al., *A Fully Integrable INsulated Gate Bipolar Transistor with a Trench Gate Structure*, 5th International Symposium on Power Semiconductor Devices and ICs, 1993, pp. 240–245.

Yen et al., *Microstructural Examination of Extended Crystal Defects in Silicon Selective Epitaxial Growth*, Journal of Electronic Materials, vol. 22, No. 11, 1993, pp. 1331–1339.

Bashir et al., *A Novel Three Dimensional BICMOS Process Using Epitaxial Lateral Overgrowth of Silocon*, IEEE 1991 Custom Integrated Circuits Conference, pp. 18.2.1–18.2.4.

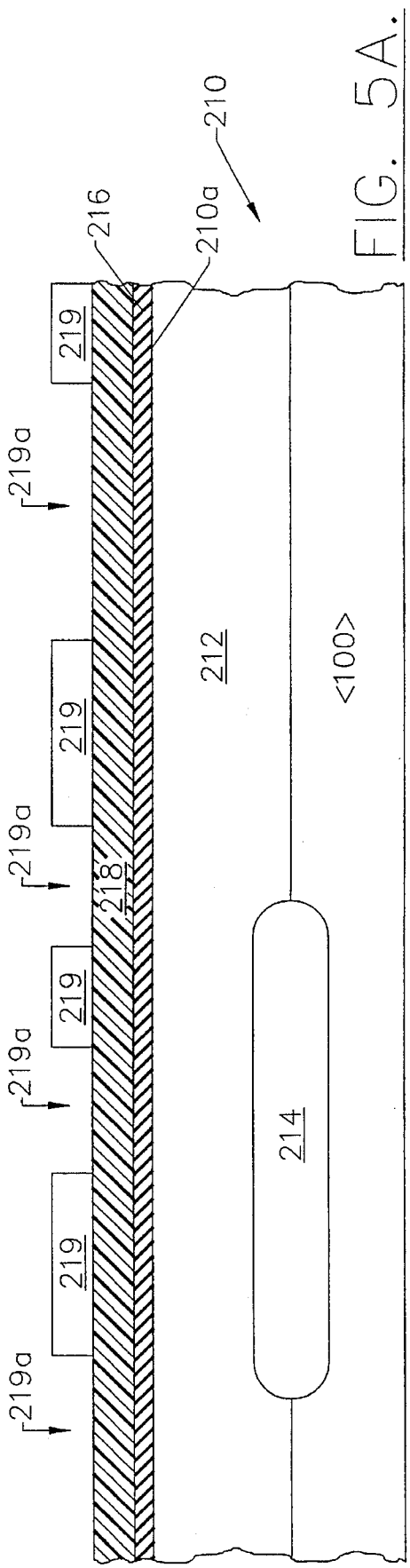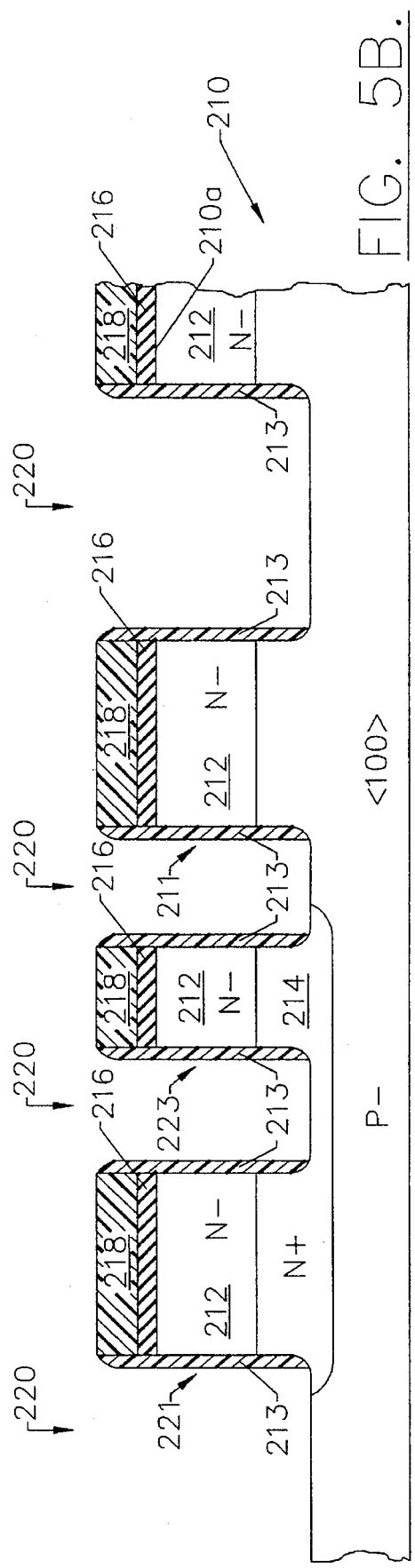

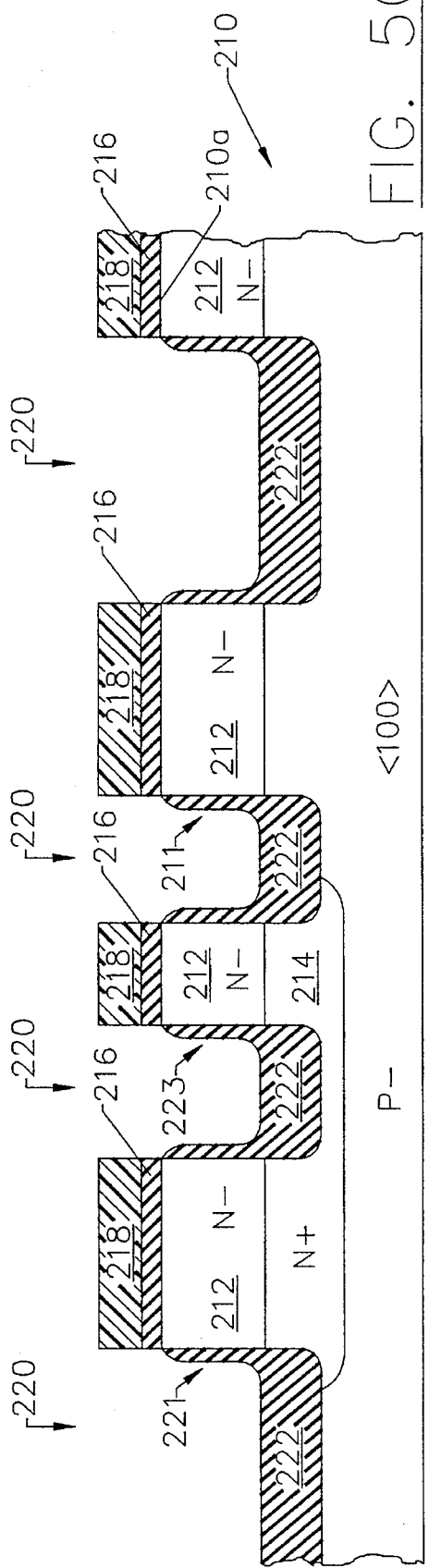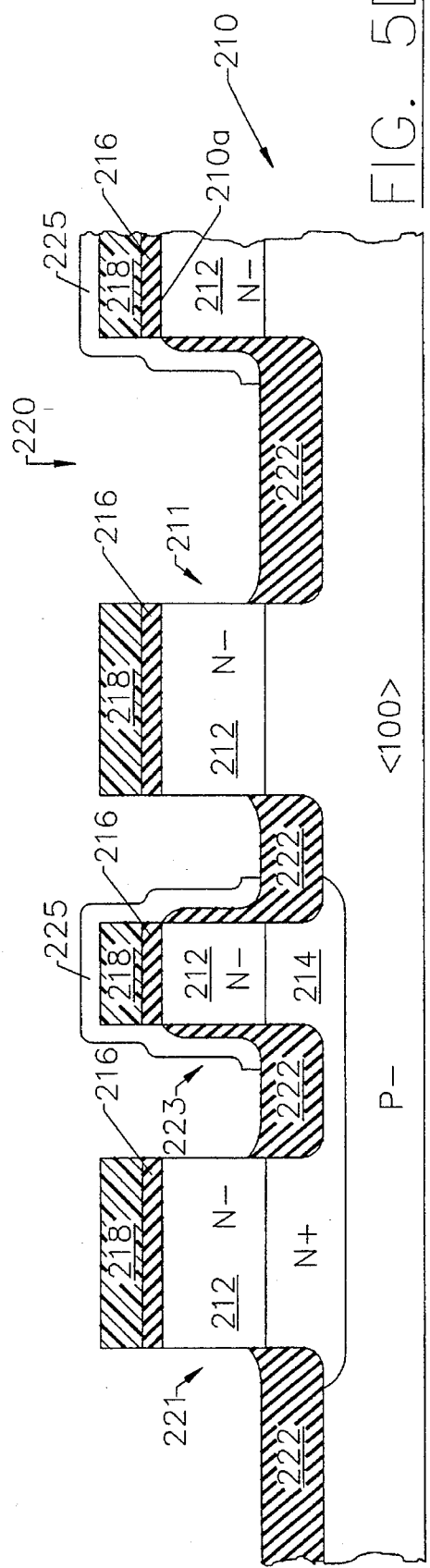

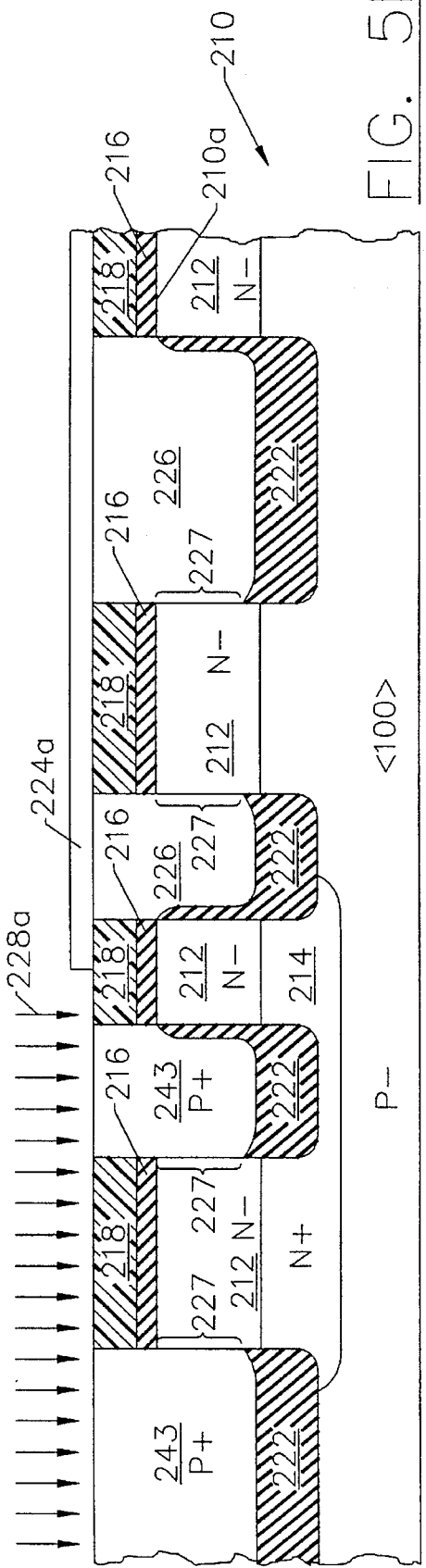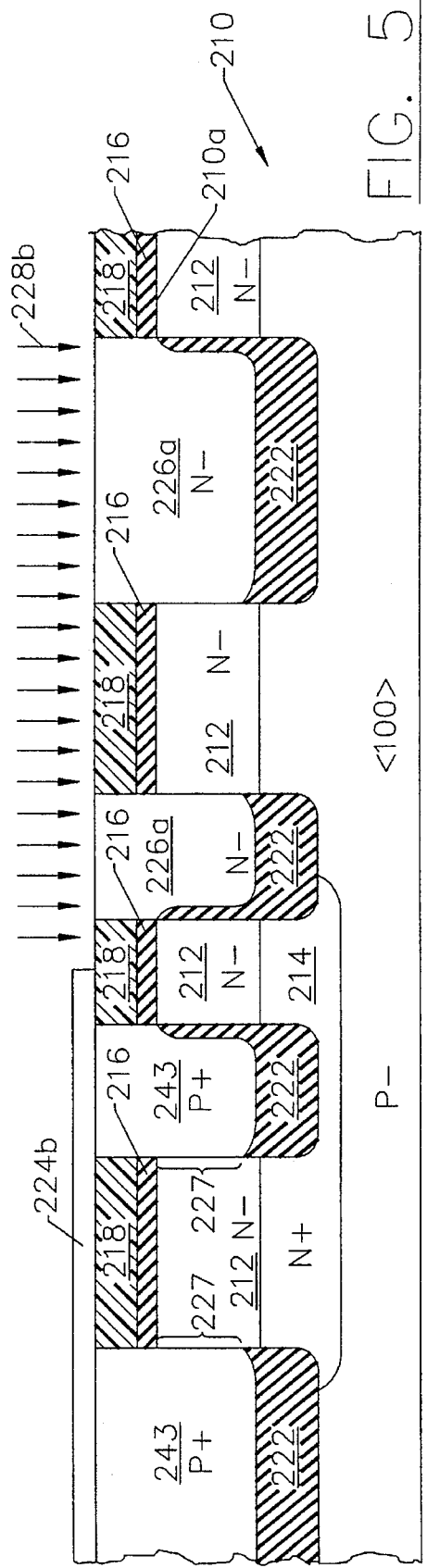

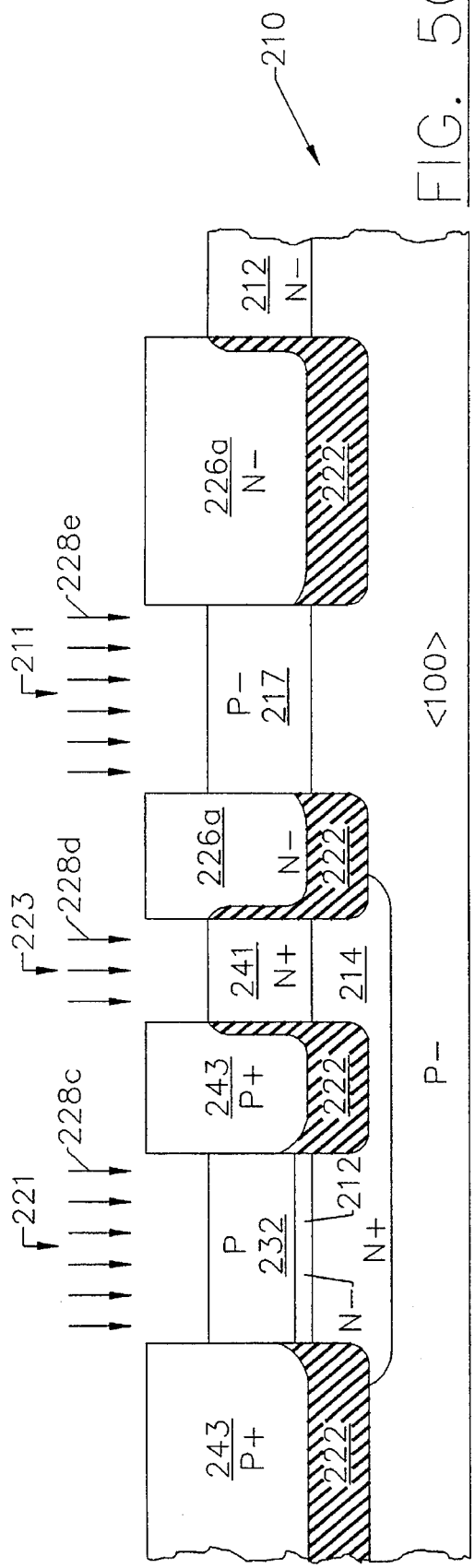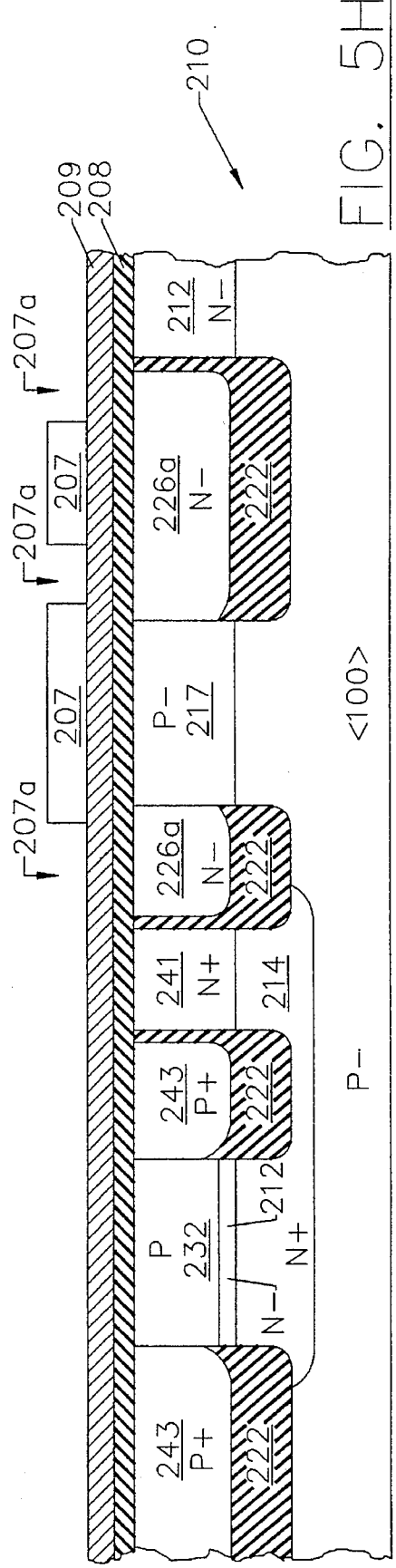

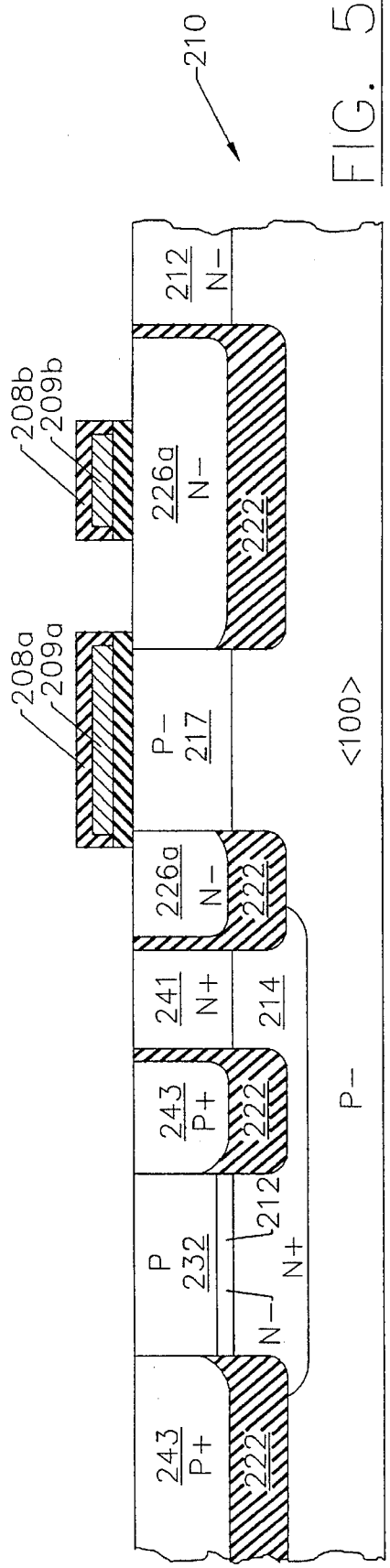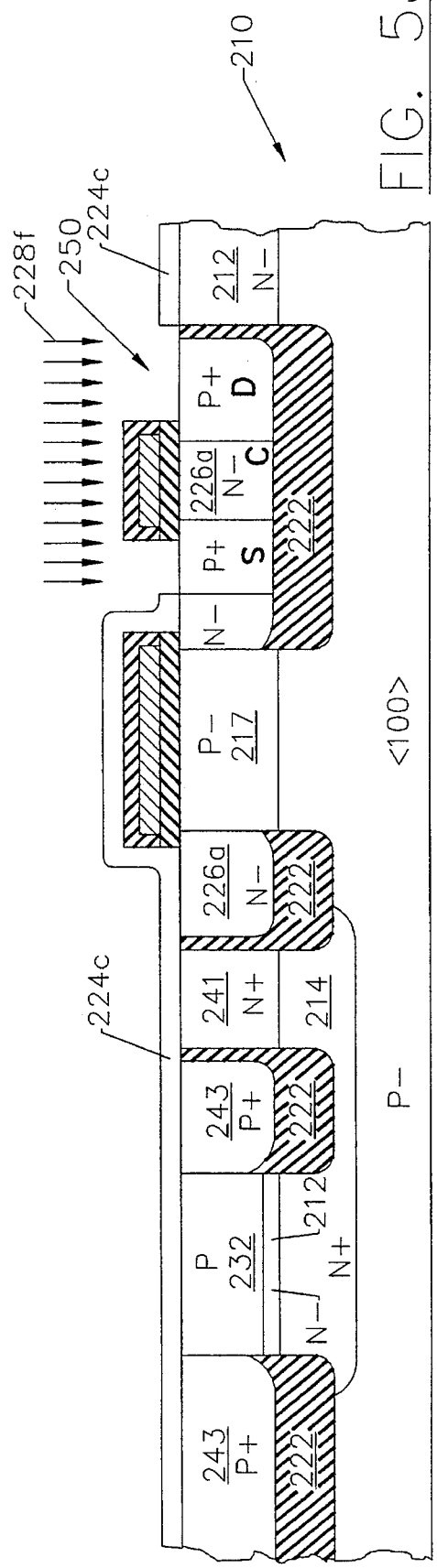

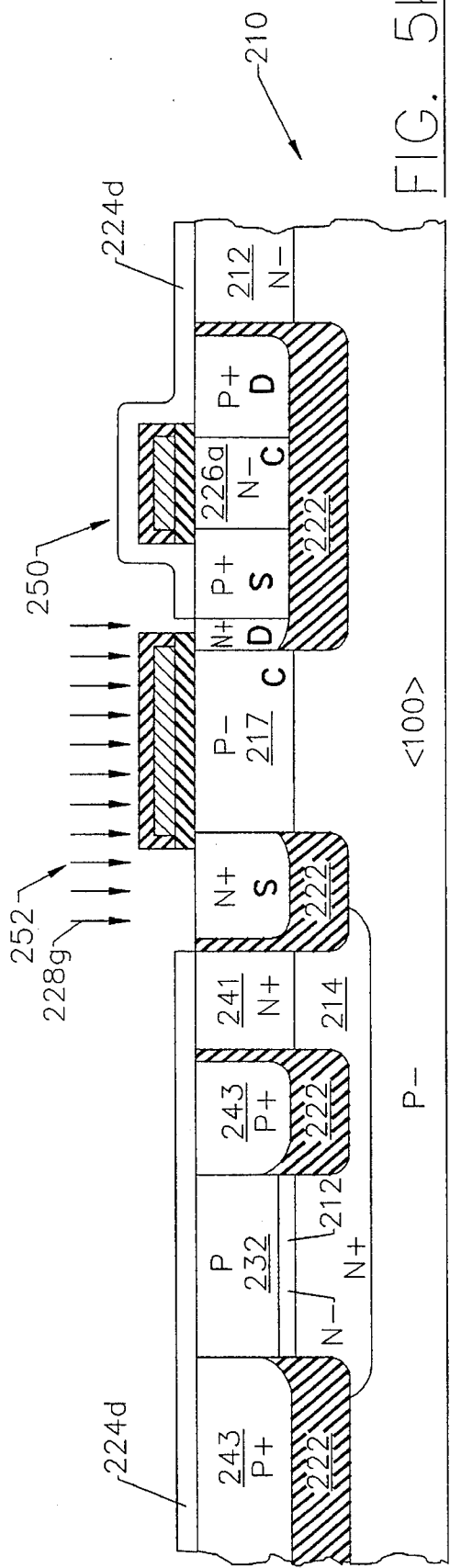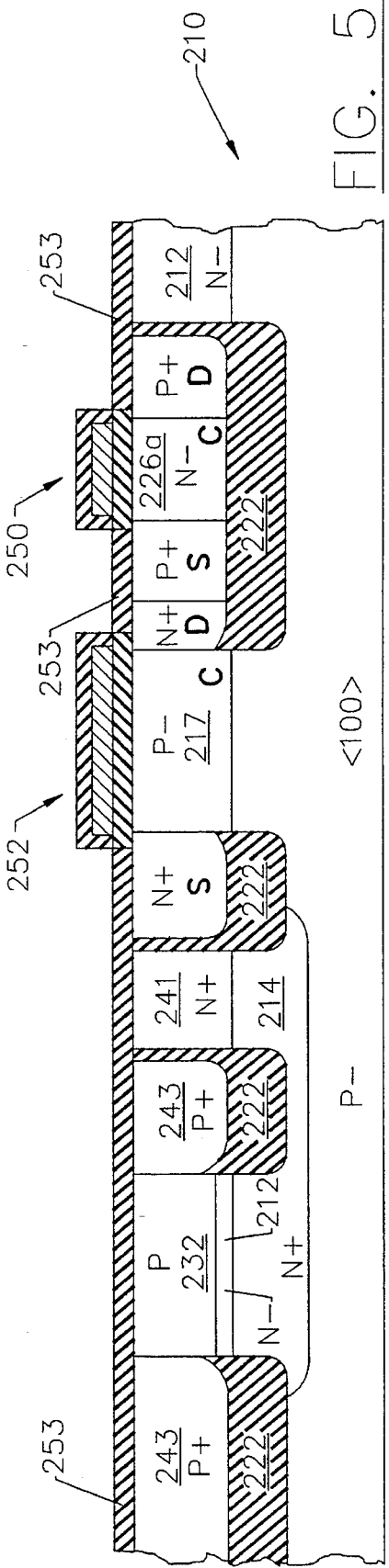

METHOD OF FORMING SEMICONDUCTOR-ON-INSULATOR ELECTRONIC DEVICES BY GROWING MONOCRYSTALLINE SEMICONDUCTING REGIONS FROM TRENCH SIDEWALLS

CROSS-REFERENCE TO RELATED APPLICATION

This application is related to application Ser. No. 08/313,893, entitled SEMICONDUCTOR-ON-INSULATOR ELECTRONIC DEVICES HAVING TRENCH ISOLATED MONOCRYSTALLINE ACTIVE REGIONS (Attorney Docket No. 5347-112), filed concurrently herewith.

FIELD OF THE INVENTION

The present invention relates to methods of forming semiconductor electronic devices, and more particularly to methods of forming semiconductor-on-insulator electronic devices.

BACKGROUND OF THE INVENTION

Semiconductor electronic devices may be formed on silicon-on-insulator (SOI) substrates with reduced parasitic and nodal capacitances, increased radiation hardness and reduced process complexity compared to bulk semiconductor devices. In particular, electronic devices such as SOI field effect transistors (FETs) typically have lower source/drain-to-substrate capacitance and higher latch-up immunity compared to their bulk counterparts. However, floating body effects caused by the presence of a continuous insulating layer may limit performance of conventional SOI FETs. Lower source-drain breakdown voltage caused by parasitic bipolar action also limits performance of conventional SOI FETs.

Electronic devices such as bipolar junction transistors (BJTs) may also benefit from being formed in monocrystalline SOI substrates, particularly when the extrinsic base and extrinsic collector contact regions are monocrystalline as well. Presently, the most popular commercial high-speed BJT structure is the Super Self-Aligned Transistor (SST) of FIG. 1. This BJT is typically characterized by a relatively low emitter-base capacitance ($C_{eb}$), but a relatively high base-collector capacitance ($C_{bc}$). Double Self-Aligned Transistors (DSTs) such as the Sidewall Contacted Structure (SICOS) of FIG. 2 typically have lower $C_{bc}$, however these devices employ a polycrystalline extrinsic base contact region. To compensate for this, the edges of the base-collector junction are moved away from the polycrystalline extrinsic base contact region to prevent the depletion region in the intrinsic base from contacting the extrinsic base contact region during operation. For example, an extrinsic-to-intrinsic base link-up region is typically used adjacent the intrinsic collector region to provide the necessary separation, as illustrated by FIG. 2. This results in an increase in the base-collector junction area and prevents even smaller $C_{bc}$ from being achieved with DST devices.

Electronic devices which include a combination of Complimentary Metal-Oxide-Semiconductor (CMOS) FETs and BJTs (e.g., BiCMOS) can also be expected to achieve higher performance characteristics when formed on SOI substrates, particularly when all the active regions of the devices are monocrystalline and floating body effects have been eliminated. Attempts have been made to form BiCMOS devices on SOI substrates. For example, U.S. Pat. No. 5,049,513 to Eklund discloses a method of fabricating a BJT and a FET transistor on an SOI substrate. U.S. Pat. Nos. 5,212,397 to See et al. and 5,258,318 to Buti et al. also disclose BiCMOS devices and methods of forming the same on SOI substrates.

Notwithstanding these attempts to incorporate BJT and FET electronic devices on SOI substrates, there still exists a need for improved electronic devices such as FETs, BJTs and BiCMOS devices on SOI substrates, and methods of forming same, which have monocrystalline active regions, lower parasitic capacitances and reduced susceptibility to floating body effects and parasitic latch-up.

SUMMARY OF THE INVENTION

It is therefore an object of the present invention to provide an improved method of forming semiconductor-on-insulator electronic devices.

It is another object of the present invention to provide an improved method of forming BiCMOS electronic devices.

It is a further object of the present invention to provide a method of forming semiconductor electronic devices having monocrystalline active regions therein.

It is still a further object of the present invention to provide a method of forming semiconductor electronic devices having reduced susceptibility to floating body effects.

These and other objects, features and advantages of the present invention are provided by a method of forming an electronic device in a monocrystalline semiconductor substrate which includes the step of etching a monocrystalline semiconductor substrate at a face thereof to define a trench having a generally vertical sidewall extending between the etched semiconductor substrate and the face. This step is then followed by the steps of forming an insulating layer on the etched semiconductor substrate, at a bottom of the trench, and then forming a monocrystalline semiconducting region from the sidewall onto the insulating layer. This latter step preferably includes the step of growing a monocrystalline semiconducting region using vertically-seeded epitaxial lateral overgrowth (VELO). These steps are then followed by the step of forming at least one active region of an electronic device in the monocrystalline semiconducting region. According to this method, the electronic device is at least partially insulated from the semiconductor substrate by the insulating layer at the bottom of the trench.

In particular, the method according to one embodiment of the present invention includes the step of etching a monocrystalline semiconductor substrate at a face thereof to define a monocrystalline mesa having an exposed vertical sidewall extending between the etched substrate and the face. The mesa can be of cylindrical, rectangular, stripe or similar geometry. This step is then followed by the step of forming a trench insulating layer on the etched semiconductor substrate and on a lowermost portion of the exposed vertical sidewall. A monocrystalline semiconducting region is then formed on the trench insulating layer preferably by growing the semiconducting region from the exposed vertical sidewall using epitaxial lateral overgrowth (ELO). Active regions of an electronic device such as a field effect transistor and/or bipolar transistor are then formed in the monocrystalline semiconducting region and in the monocrystalline mesa, adjacent thereto.

The above-described etching step may also be preceded by the steps of forming a masking layer on the face and patterning the masking layer to expose portions of the substrate, adjacent the patterned masking layer. Accordingly, the etching step can be performed to etch the exposed portions of the substrate and thereby define a monocrystalline mesa which has generally vertical sidewalls.

In-situ doping of the semiconducting region can also be achieved by simultaneously doping the monocrystalline semiconducting region during the growing step. For example, the substrate can be of first conductivity type and the semiconducting region can be doped with a dopant of second conductivity type while it is being grown. The patterning and etching steps can also be performed to define a mesa having first and second opposite sidewalls. Thereafter, first and second insulating layers can be formed on the etched substrate and on lowermost portions of the first and second sidewalls, respectively. Then first and second monocrystalline semiconducting regions can be simultaneously grown from uppermost portions of the first and second sidewalls and an electronic device, such as a field effect transistor, can be formed in the monocrystalline mesa and in the first and second monocrystalline semiconducting regions.

The method according to another embodiment of the present invention includes the steps of forming a silicon-on-insulator BiCMOS cell in a monocrystalline semiconductor substrate so that, each of the active regions of the cell are monocrystalline. This embodiment includes the steps of etching a monocrystalline semiconductor substrate at a face thereof to define a plurality of adjacent trenches and then lining the bottoms of the trenches with trench insulating layers. Respective monocrystalline semiconducting regions are then simultaneously formed from the sidewalls of the trenches onto the respective trench insulating layers using epitaxial lateral overgrowth (ELO). Next, monocrystalline active regions of a field effect transistor(s) and a bipolar junction transistor are formed in the adjacent semiconducting regions. Accordingly, a BiCMOS cell having trench isolated (e.g., SOI) active regions can be easily integrated at high levels on a semiconductor substrate. Moreover, the devices therein can be formed with reduced susceptibility to floating body effects and without the need for complex extrinsic-to-intrinsic base link-up regions.

BRIEF DESCRIPTION OF THE DRAWINGS

FIGS. 5A–5M are schematic cross-sectional views of intermediate structures illustrating a method of forming an electronic device fabricated according to a third embodiment of the present invention.

DESCRIPTION OF A PREFERRED EMBODIMENT

The present invention will now be described more fully hereinafter with reference to the accompanying drawings, in which preferred embodiments of a method of forming semiconductor-on-insulator (SOI) electronic devices and electronic devices formed therefrom are illustrated. This invention may, however, be embodied in different forms and should not be construed as limited to only the embodiments set forth herein. Rather, these embodiments are provided so that this disclosure will be thorough and complete, and will fully convey the scope of the invention to those skilled in the art. Like numbers refer to like elements throughout. For greater clarity, the thickness of the illustrated layers and regions have been exaggerated.

Referring now to FIGS. 3A–3L, a method of forming an electronic device according to a first embodiment of the present invention is illustrated. In particular, FIGS. 3A–3L illustrate the steps of forming a preferred SOI NMOS transistor having SOI monocrystalline source and drain regions and a substrate-connected channel region. This transistor has the benefits of conventional SOI FETs such as low source/drain-to-substrate capacitance, latch-up immunity and dielectric isolation which allows for higher integration densities. However, this embodiment does not suffer from floating body effects or low source-drain breakdown voltage caused by parasitic bipolar action, which are commonly associated with conventional SOI devices.

Figure 3A:
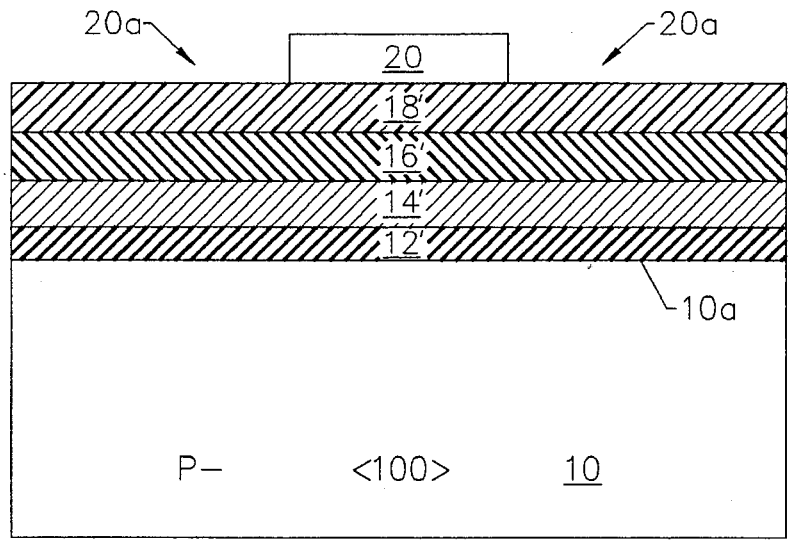
FIGS. 3A–3L are schematic cross-sectional views of intermediate structures illustrating a method of forming an electronic device fabricated according to a first embodiment of the present invention.

Referring specifically to FIG. 3A, an exemplary <100> oriented monocrystalline silicon substrate 10 (shown as P–) is illustrated having a plurality of layers 12'–18' thereon. The method according to this embodiment begins with the step of forming a first insulating layer 12' on a face 10a of the silicon substrate 10. The first insulating layer 12' may be silicon dioxide ($SiO_2$) or another dielectric having similar characteristics. The thickness of the first insulating layer 12' is preferably in the range of about 15 to 50 Å and can be formed using conventional deposition or dry oxidation techniques. Thereafter, an electrically conductive layer 14', such as a relatively thick polycrystalline silicon layer (poly-Si) (or another conductive layer such as a silicide or salacide), is formed on the first insulating layer 12'. As understood by those skilled in the art, a poly-Si layer having a thickness of about 3500 Å may be deposited using Low Pressure Chemical Vapor Deposition (LPCVD).

Next, a second insulating layer 16' is formed on the conductive layer 14'. The second insulating layer 16' is also preferably $SiO_2$ or a similar dielectric. For example, the second insulating layer 16' can be formed by growing a relatively thick wet $SiO_2$ of about 2000 Å from the conductive layer 14'. The second insulating layer forming step is then followed by the step of forming a reactive-ion-etch resistant (RIE-resistant) layer 18', such as silicon nitride ($Si_3N_4$) having a thickness of about 1000 Å, on the second insulating layer 16'. This layer 18' can be deposited by LPCVD as well. A first masking layer 20, such as photoresist, having a thickness in the range of about 1,000 to 10,000 Å, may also be formed and patterned, as illustrated, using techniques well known to those skilled in the art.

Figure 3B:
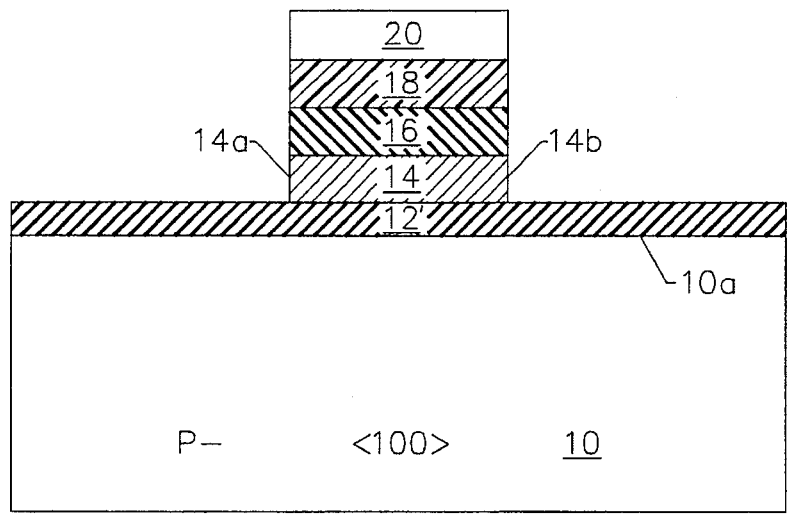
Figure 3C:
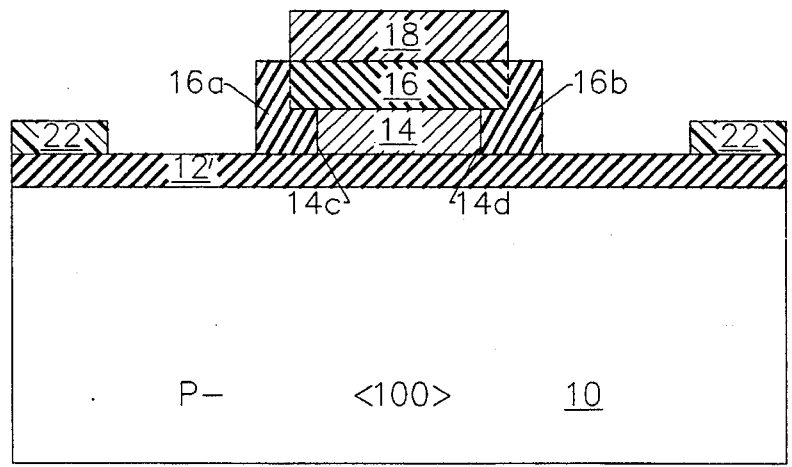
Figure 3D:
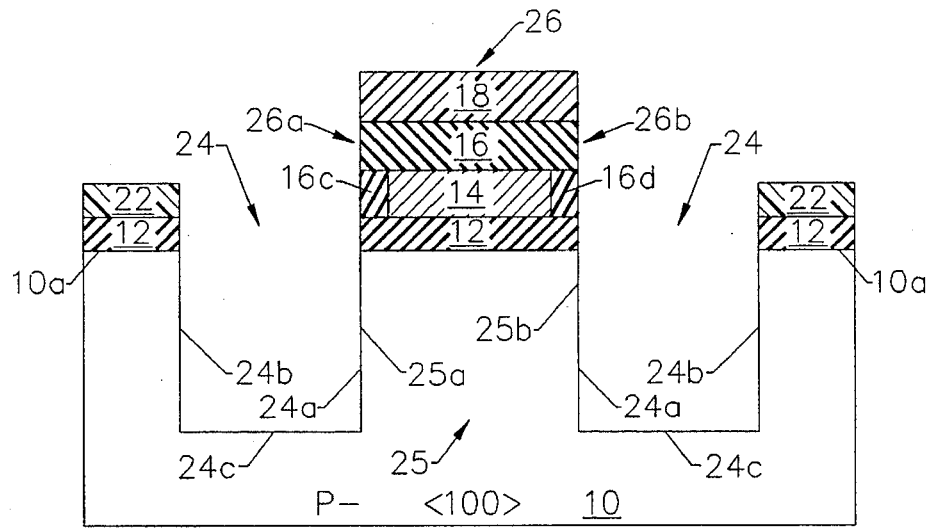

Referring now to FIG. 3B, the conductive layer 14', second insulating layer 16' and the RIE-resistant layer 18' of FIG. 3A are then chemically etched in the exposed areas 20a. This step defines a gate electrode layer 14 having first and second ends 14a–b, a second gate insulating layer 16 and a first RIE-resistant mask layer 18. As illustrated by FIG. 3C, the masking layer 20 is removed and then electrically insulating spacers 16a–b are formed on the first and second ends 14a–b of the gate electrode layer 14. Preferably, the insulating spacers 16a–b are $SiO_2$ having a thickness of about 2000 Å. As understood by those skilled in the art, the insulating spacers 16a–b can be formed by oxidizing the first and second ends 14a–b of a poly-Si gate electrode layer 14.

This oxidizing step also defines the actual length of the gate electrode since part of the gate electrode layer is consumed during oxidation. Accordingly, the actual length of the gate electrode 14 is defined by new ends 14c–d. A second RIE-resistant mask layer 22 such as $Si_3N_4$ is then lithographically patterned on the first insulating layer 12', as illustrated.

A blanket reactive ion etching step using Freon 115 is then preferably performed to selectively etch $SiO_2$ and Si anisotropically, using the first and second RIE-resistant layers 18 and 22 as etch masks. This etching step forms an insulated gate electrode 26 on a mesa 25 which has exposed vertical sidewalls 25a–b. The mesa 25 is preferably of stripe or similar geometry. The RIE etching step also defines adjacent trenches 24, each of which has opposing vertical sidewalls 24a–b in the silicon substrate 10. The $SiO_2$ insulating spacers 16a–b are also partially etched, but the gate electrode 14 still remains insulated by thinner insulating spacers 16c–d.

Figure 3E:
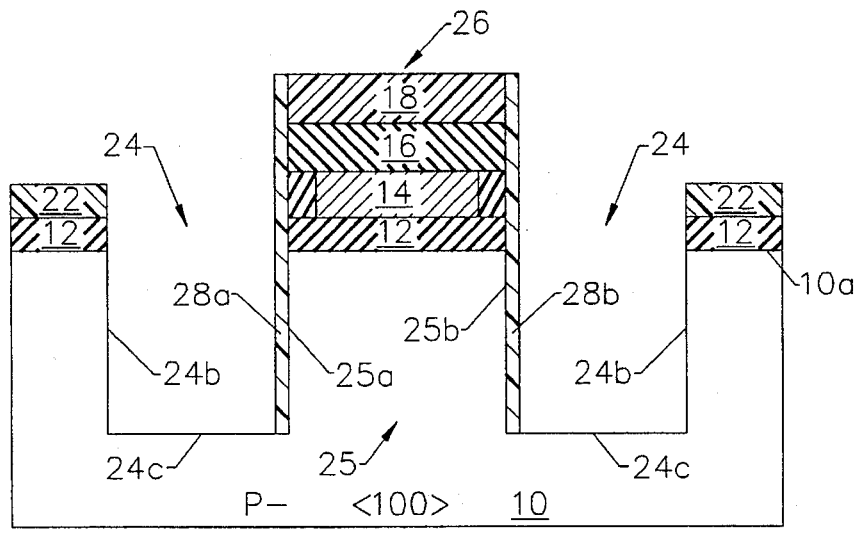
Figure 3F:
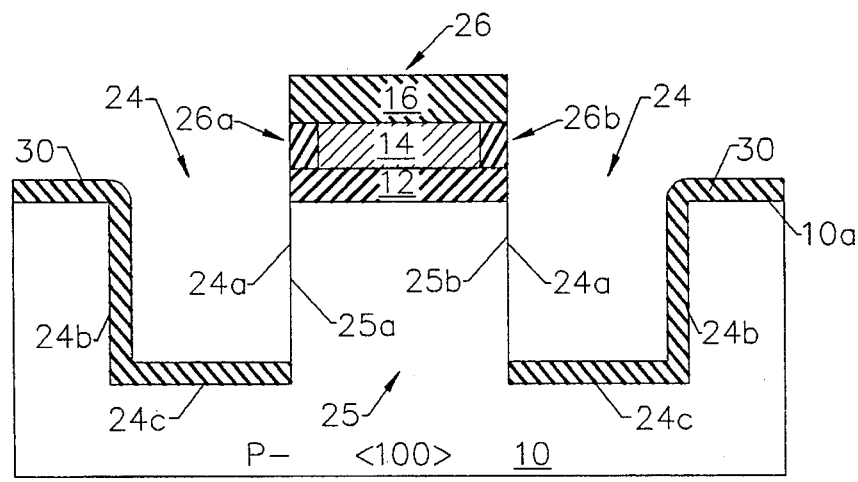

Referring now to FIGS. 3E–3F, additional spacers 28a–b are also formed adjacent the sidewalls 26a–b of the insulated gate electrode 26 and adjacent the sidewalls 25a–b of the mesa. 25. This spacer forming step is performed so that relatively thick trench insulating layers can be selectively formed adjacent the trench bottoms 24c and adjacent the outside sidewalls 24b, but not on the mesa sidewalls 25a–b. These spacers 28a–b are preferably $Si_3N_4$ spacers which have a sufficient thickness of about 1000 Å to inhibit $SiO_2$ growth adjacent the mesa sidewalls 25a–b. Trench insulating layers 30 are then formed on the trench bottoms 24c and sidewalls 24b by performing a wet oxidation of the structure of FIG. 3E and then removing the nitride spacers 28a–b and the first and second RIE-resistant layers 18 and 22, preferably with phosphoric acid. As illustrated, the trench insulating layers 30 ultimately extend along the outside trench sidewalls 24b, on the trench bottoms 24c and on lowermost portions of the mesa sidewalls 25a–b (i.e., inner trench sidewalls 24a), however, the insulating layers 30 do not extend adjacent uppermost portions of the mesa sidewalls 25a–b (24a).

Figure 3G:
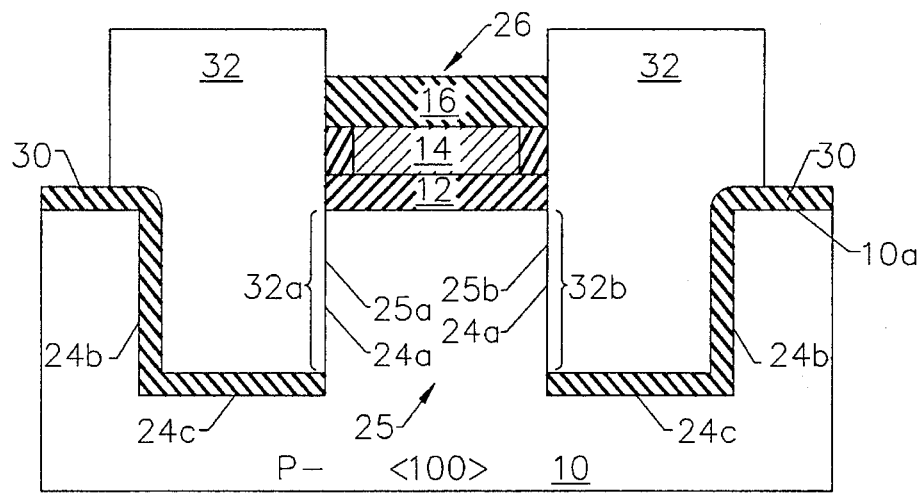
Figure 3H:
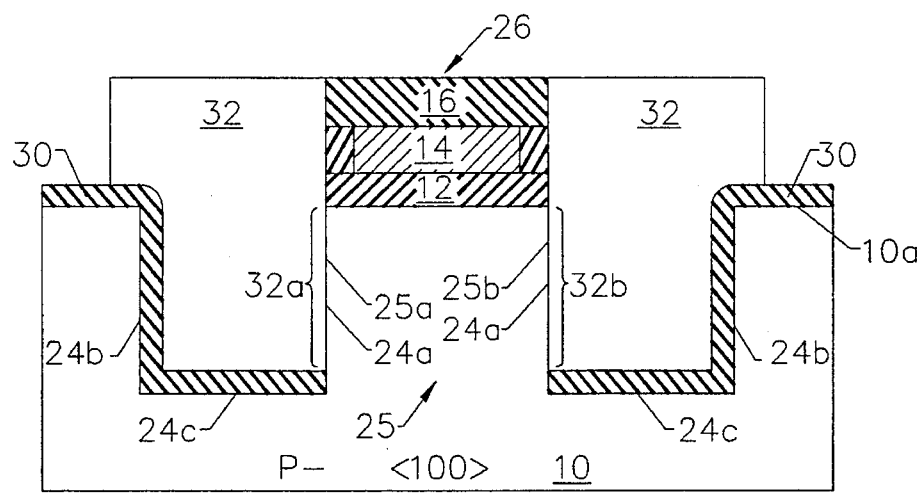

Referring now to FIGS. 3G–3H, monocrystalline semiconducting regions 32 are then formed from the uppermost (i.e., exposed) portions of the mesa sidewalls 25a–b onto the trench insulating layers 30. Preferably, this step includes the step of growing monocrystalline silicon from the vertical seed windows 32a–b using vertically-seeded epitaxial lateral overgrowth (VELO). This can be done by placing the structure of FIG. 3F in a LPCVD epi growth reactor (not shown) and then growing monocrystalline epitaxial silicon from the windows 32a–b. The epitaxially overgrown silicon (EOS) semiconducting regions 32 fill the trenches 24 as illustrated, however, they are then chemically/mechanically planarized using the top of the second gate insulating layer 16 as a "planarizing/etch stop", as illustrated by FIG. 3H As described more fully hereinbelow, one or more active regions of an electronic device such as an FET can be formed in the semiconducting regions 32. These active regions will be electrically isolated from the substrate 10 by the trench insulating layers 30.

Referring again to FIG. 3G, in-situ doping using phosphine as an N-type dopant gas in the epi reactor can also be performed simultaneously with the growing step to form N-type semiconducting regions 32. The concentration of the dopant gas can also be increased during the growing step so that relatively lightly doped N-type regions extend adjacent the mesa 25 and more highly doped N-type regions extend adjacent an upper surface of the semiconducting regions 32.

Figure 3I:
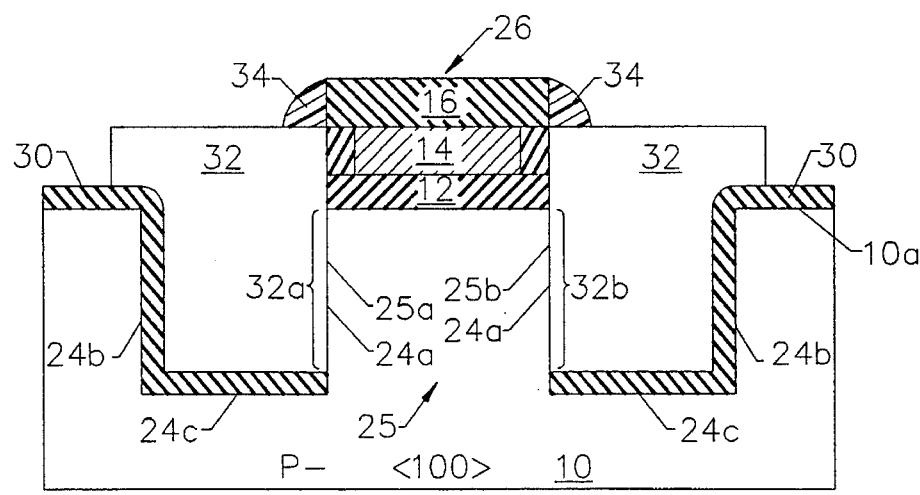
Figure 3J:
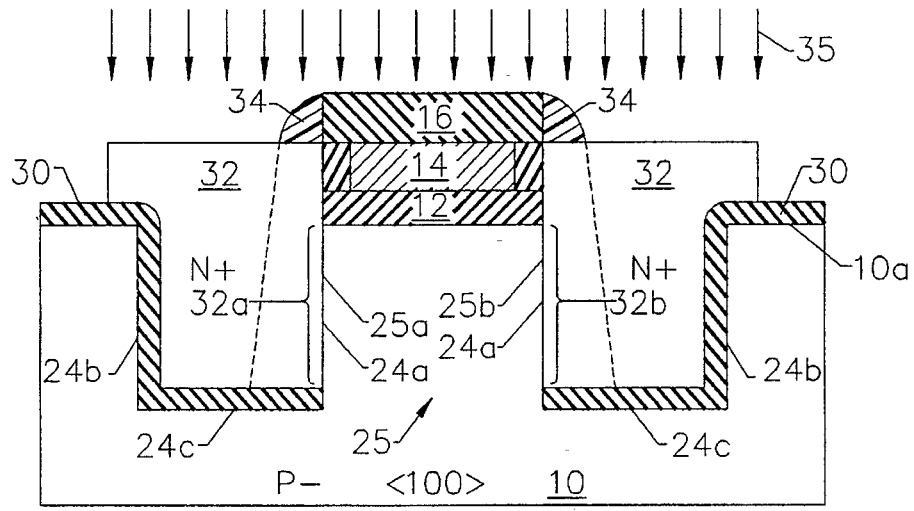
Figure 3K:
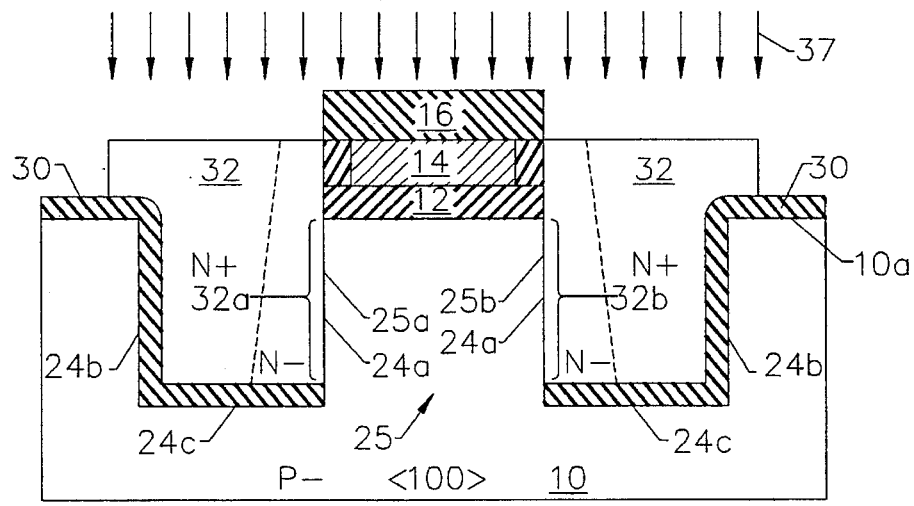

Referring now to FIGS. 3I–3J, the semiconducting regions 32 can alternatively be doped after the growing step has been completed. For example, the semiconducting regions 32 can be etched back using a blanket RIE etching step and then sidewall spacers 34, such as $Si_3N_4$, can be formed adjacent the second gate insulating layer 16. At this stage, a heavy dose blanket arsenic or phosphorus N+ implant 35 can be used to highly dope the semiconducting regions 32 (shown as N+) away from the windows 32a–b, as illustrated by the dotted lines of FIG. 3J. The sidewall spacers 34 can then be removed and a corresponding light dose blanket N-type implant 37 can be performed to lightly dope the semiconducting regions 32 (shown as N–) adjacent the windows 32a–b, as illustrated by FIG. 3K.

Figure 3L:
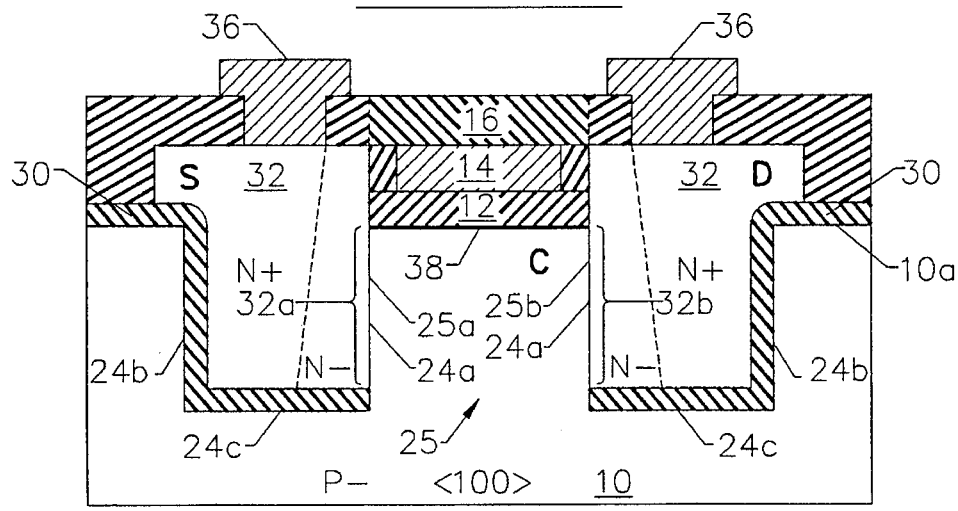

Finally, dopant anneal, oxidation and contact metallization steps are performed to form an enhancement-mode NMOS transistor, as illustrated by FIG. 3L, wherein first, second and third monocrystalline semiconducting regions extend in the substrate 10 and in the adjacent trenches 24, respectively. These three semiconducting regions include the channel region (C) (shown as P–), and the source (S) and drain (D) regions (shown as N–/N+) of the NMOS transistor. As illustrated, vertically displaced source and drain ohmic contacts 36 are provided on the source and drain regions, adjacent the highly doped portions thereof (shown as N+). As understood by those skilled in the art, the application of a sufficiently positive bias, to gate electrode 14 will cause the formation of an N-type inversion-layer channel 38 in the channel region (C), which electrically connects the source (S) to the drain (D). However, the channel region (C) is not electrically isolated from the bulk portion of the substrate 10 like conventional SOI FETs. Accordingly, the NMOS FET of FIG. 3L has reduced susceptibility to floating body effects and parasitic latch-up.

Figure 1:
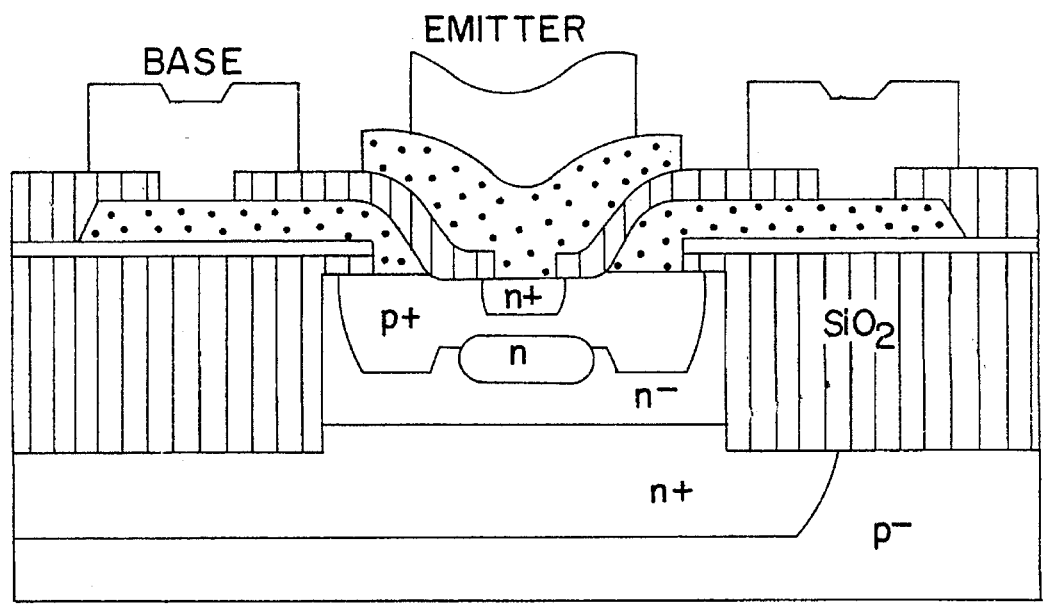
FIG. 1 illustrates a prior art Super Self-Aligned Transistor (SST).
Figure 2:
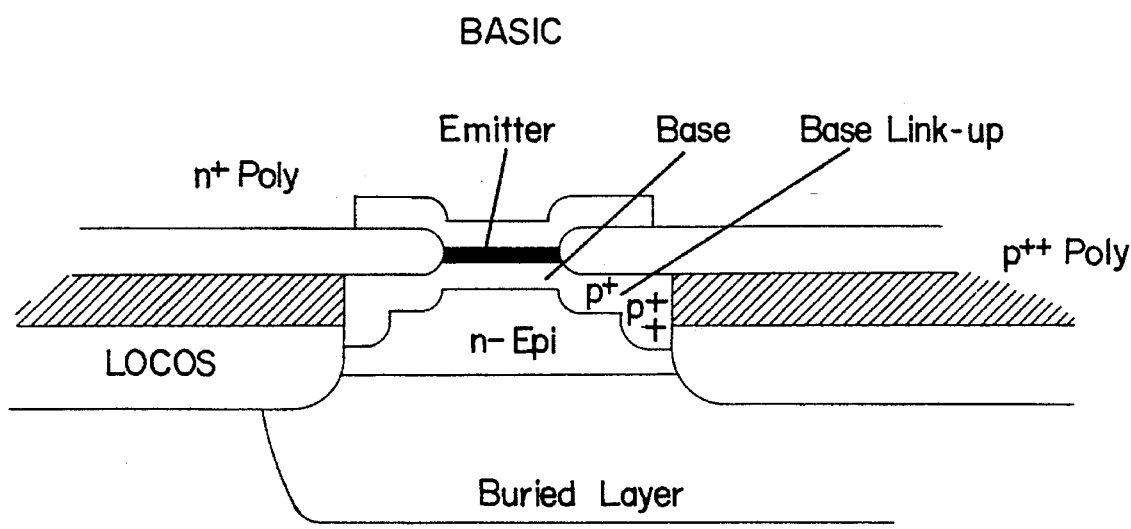
FIG. 2 illustrates a prior art Double Self-Aligned Transistor (DST).

Referring now to FIGS. 4A–4L, a method of forming an electronic device according to a second embodiment of the present invention is illustrated. In particular, FIGS. 4A–4L illustrate the steps of forming a bipolar junction transistor (BJT) which is generally compatible with the steps illustrated and described by FIGS. 3A–3L and the accompanying description. The BJT of the present invention includes, among other things, monocrystalline intrinsic and extrinsic base regions. The present invention eliminates the need for the complex intrinsic-to-extrinsic base link-up regions of the prior art as illustrated by the SICOS DST of FIG. 2. This helps to minimize the base-collector junction area and capacitance and improves the electrical performance of the BJT.

Figure 4A:
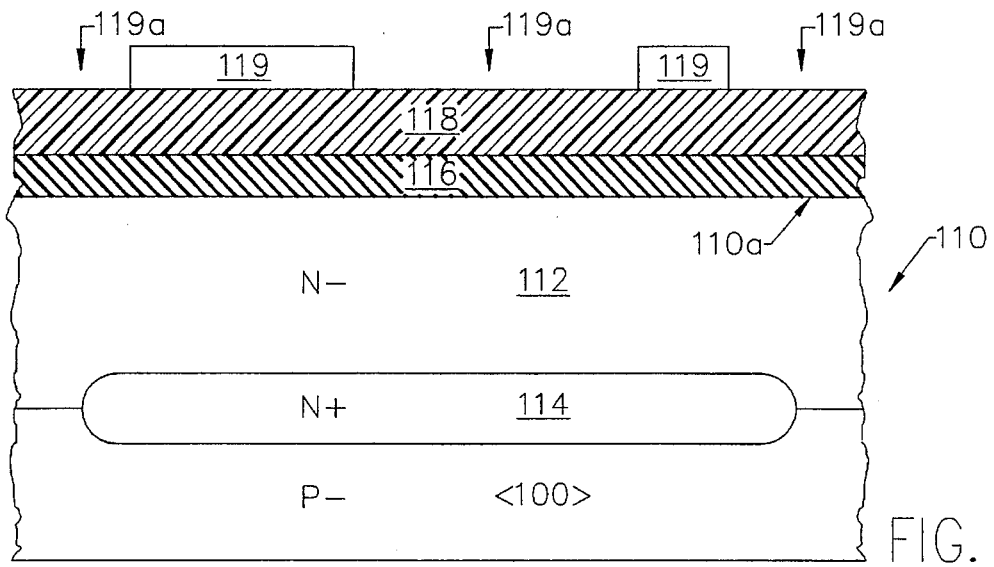
FIGS. 4A–4L are schematic cross-sectional views of intermediate structures illustrating a method of forming an electronic device fabricated according to a second embodiment of the present invention.

Referring specifically to FIG. 4A, an exemplary <100> oriented monocrystalline silicon substrate 110 (shown as P–) is illustrated having a lightly doped epitaxial layer 112 thereon (shown as N–). A relatively highly doped buried layer 114 (shown as N+) is also provided in the substrate 110, as illustrated. A stress relief layer 116 is then formed on the substrate 110, at a face 110a thereof. The stress relief layer 116 is preferably a 900 Å thick layer of grown $SiO_2$. A nitride layer 118 such as $Si_3N_4$ is also preferably formed on the stress relief layer 116 by LPCVD. This is followed by the formation and patterning of a masking layer 119 such as photoresist on the nitride layer 118 using techniques well-known to those skilled in the art. As described more fully hereinbelow, the masking layer 119 is patterned to define an intrinsic collector mesa and an extrinsic collector contact mesa of the aforementioned BJT.

Figure 4B:
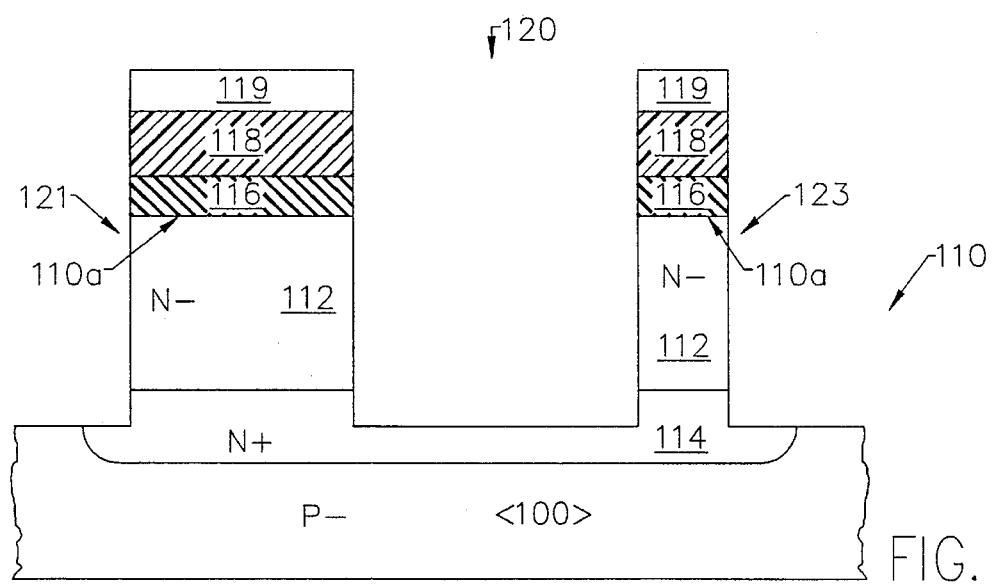

Referring now to FIG. 4B, the nitride layer 118, the stress relief layer 116 and the epitaxial layer 112 are then anisotropically etched in the exposed area 119a. In particular, dry etching with SF$_6$ is preferably performed to remove the nitride layer 118 in the exposed areas 119a and then Freon 115 is used to remove the stress relief layer 116 and the epitaxial layer 112. These steps define a plurality of adjacent trenches in the substrate and particularly a first trench 120 which extends between the N+ buried layer 114 and the face 110a. The adjacent trenches also define the intrinsic collector mesa 121 and the collector contact mesa 123 which extend in a third dimension orthogonal to the illustrated cross-section. As understood by those skilled in the art, the intrinsic collector mesa 121 may be of cylindrical, rectangular, stripe or similar geometry. For example, the illustrated trenches on either side of the intrinsic collector mesa 121 may extend parallel to each other or be part of a single surrounding trench.

Figure 4C:
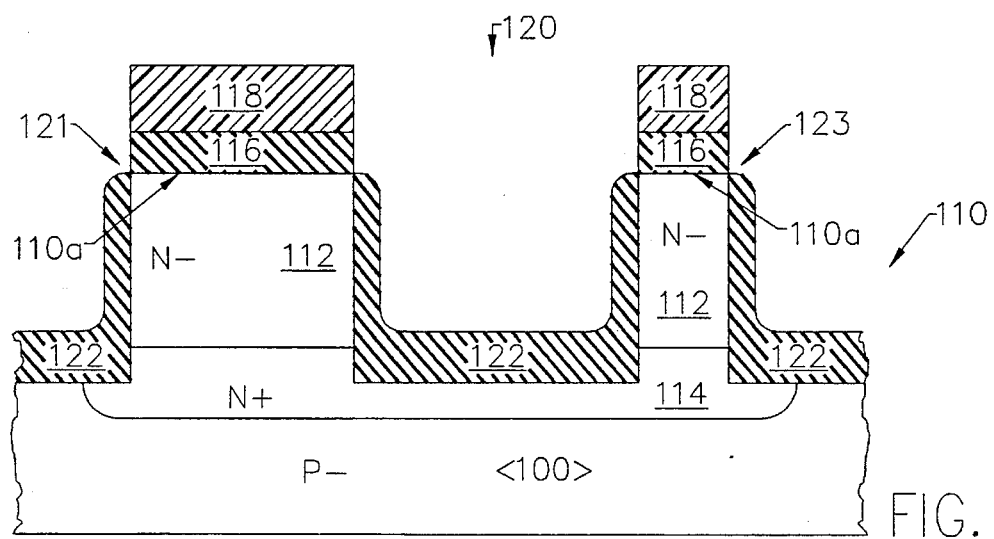
Figure 4D:
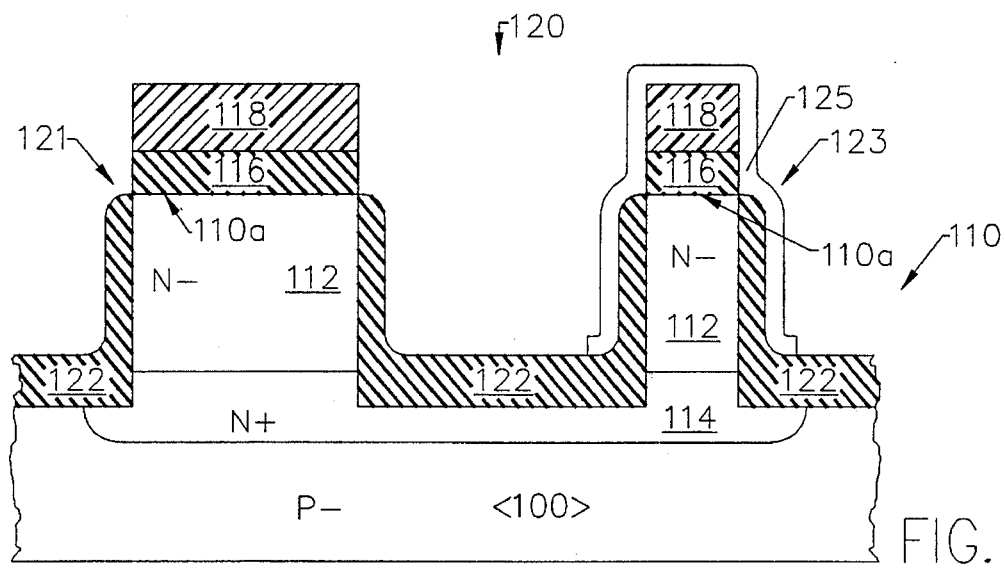
Figure 4E:
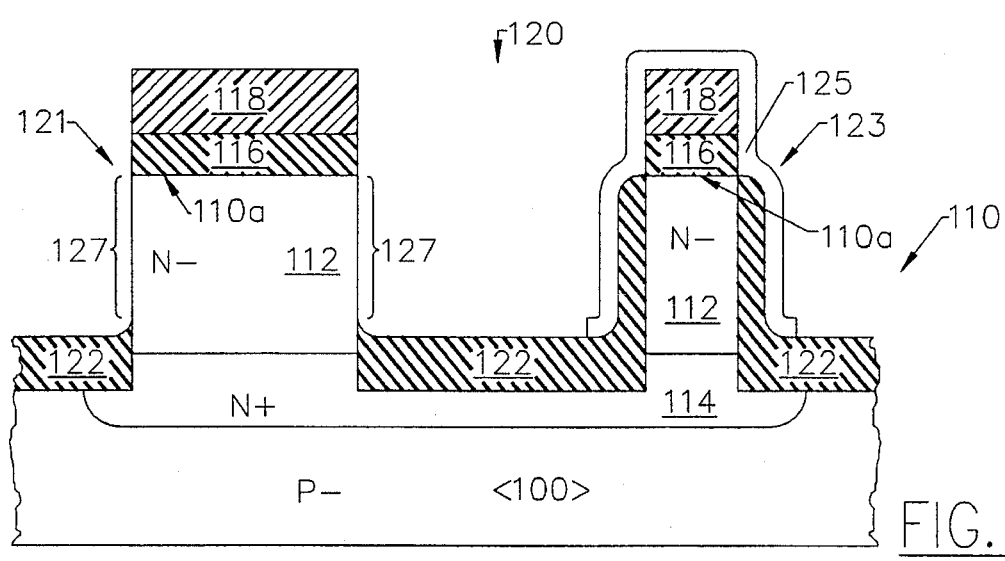

Referring now to FIG. 4C, the masking layer 119 is removed and then trench insulating layers 122 such as SiO$_2$ are formed at the bottoms and along the sidewalls of the adjacent trenches. As illustrated, relatively thick SiO$_2$ is formed adjacent the bottoms of the trenches and relatively thin SiO$_2$ is formed adjacent the sidewalls of the trenches. This can be achieved by taking advantage of the enhanced oxidation rate of the N+ buried layer 114 relative to the N– epitaxial layer 112. Alternatively, nitride spacers (not shown) can be formed adjacent sidewalls of the trenches to inhibit SiO$_2$ growth as described above with reference to FIG. 3E. A non-critical lithographic step using photoresist as a mask 125 is then preferably performed to protect the SiO$_2$ on the sidewalls of the collector contact mesa 123, as illustrated by FIG. 4D. A solution of BHF is then preferably used to etch the insulating layers 122 on the sidewalls of the intrinsic collector mesa 121, but still leave sufficient insulation on the bottoms of the trenches, as illustrated by FIG. 4E. The insulation on the bottoms of the trenches acts to electrically isolate the trenches from the N+ buried layer 114 and the P– substrate 110, as described more fully below. The photoresist mask 125 is then removed.

Figure 4F:
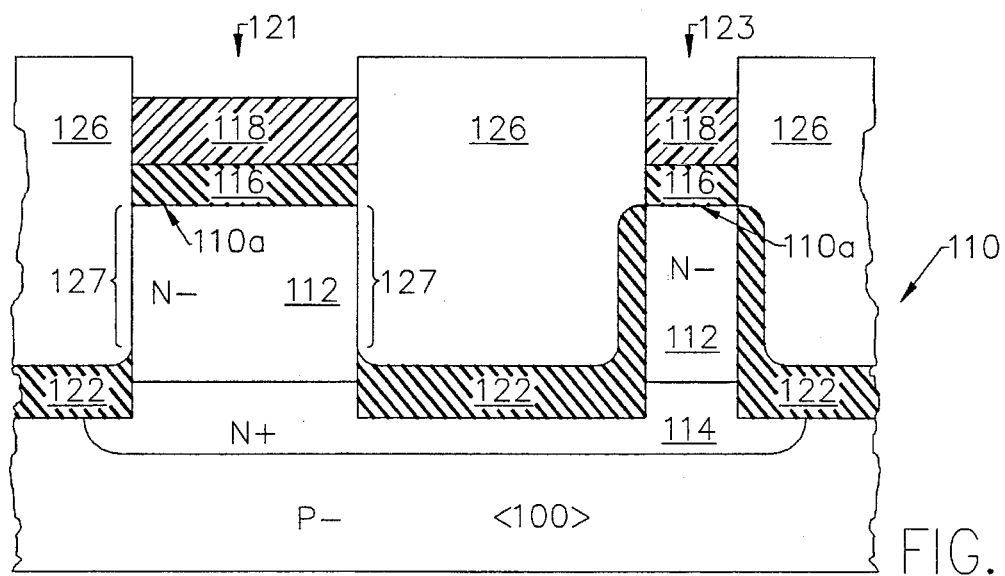
Figure 4G:
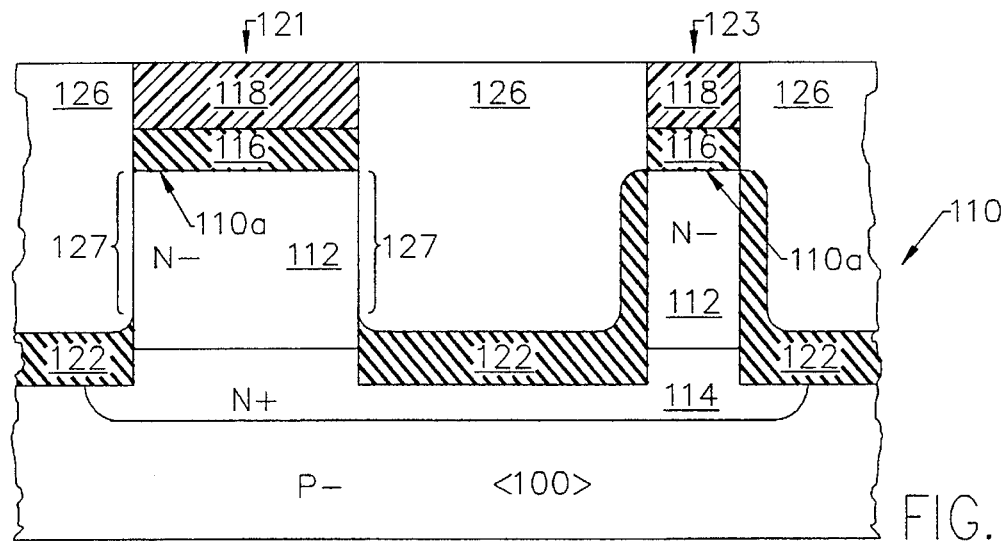

Referring now to FIGS. 4F–4G, a plurality of monocrystalline silicon layers 126 are then formed from the uppermost and exposed portions of the sidewalls (shown as 127) of the intrinsic collector mesa 121 onto the trench insulating layers 122. Preferably, this step includes the step of growing monocrystalline silicon from the windows 127 using vertically-seeded epitaxial lateral overgrowth (VELO). This can be done by placing the structure of FIG. 4E in a LPCVD epi growth reactor (not shown) and then growing monocrystalline epitaxial silicon from the windows 127. The epitaxially overgrown silicon (EOS) layers 126 fill the trenches as illustrated. The semiconducting regions 126 are then chemically/mechanically planarized using the nitride layers 118 as a planarizing/etch stop, as illustrated by FIG. 4G.

Figure 4H:
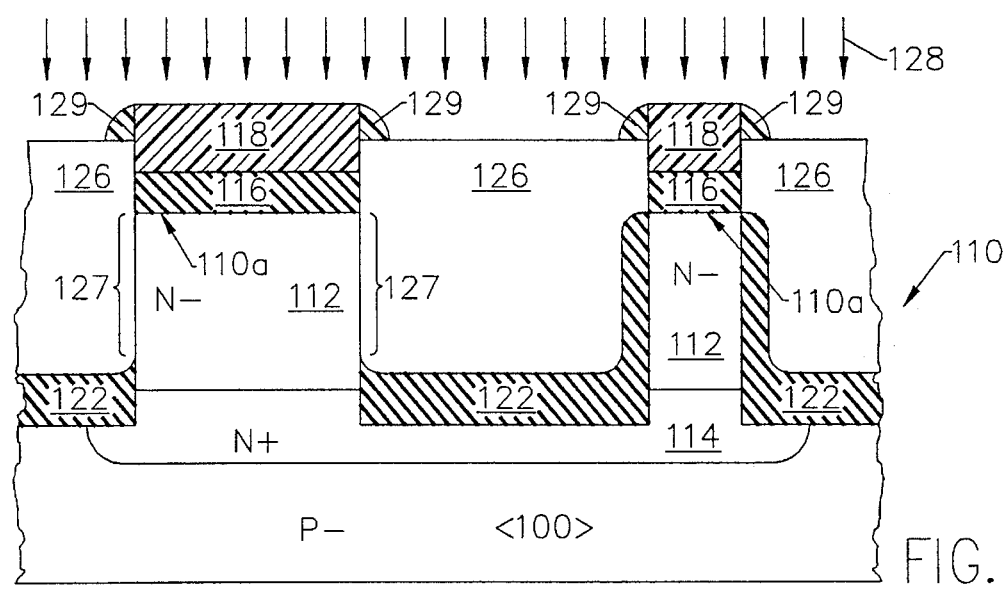

Referring now to FIG. 4H, a heavy dose, blanket P+ implant 128 such as boron (B) is then used to dope the monocrystalline silicon layers 126 to form P+ monocrystalline extrinsic base regions 143, while the intrinsic collector mesa 121 and the extrinsic collector contact mesa 123 are protected by the self-aligned nitride layers 118 thereon. To prevent boron diffusion into the intrinsic collector mesa 121, the implant 128 can be spaced away from the sidewalls of the mesa 121 using nitride spacers 129. This can be achieved by performing blanket RIE to etch back the monocrystalline silicon layers 126 and then forming nitride spacers 129 adjacent the sidewalls of the intrinsic collector mesa 121.

Figure 4I:
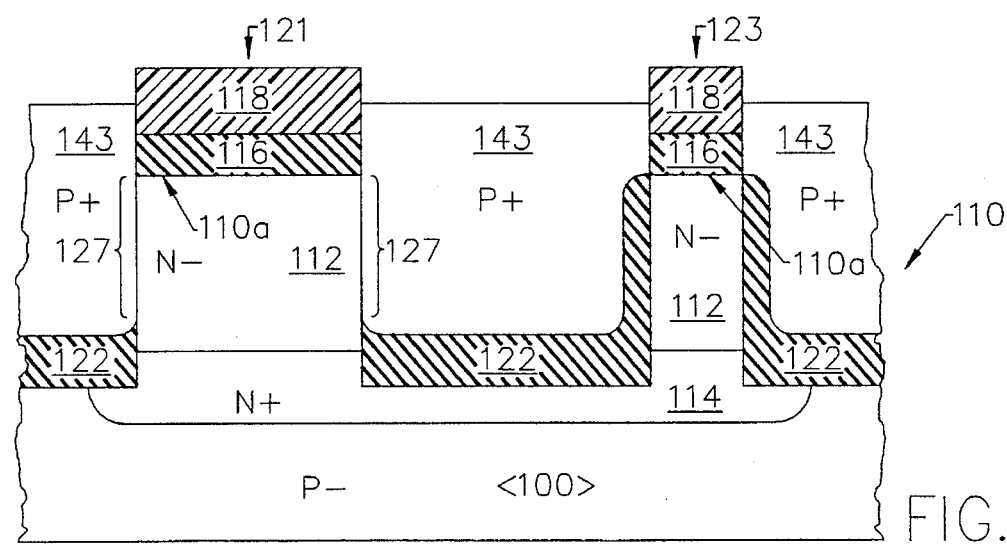
Figure 4J:
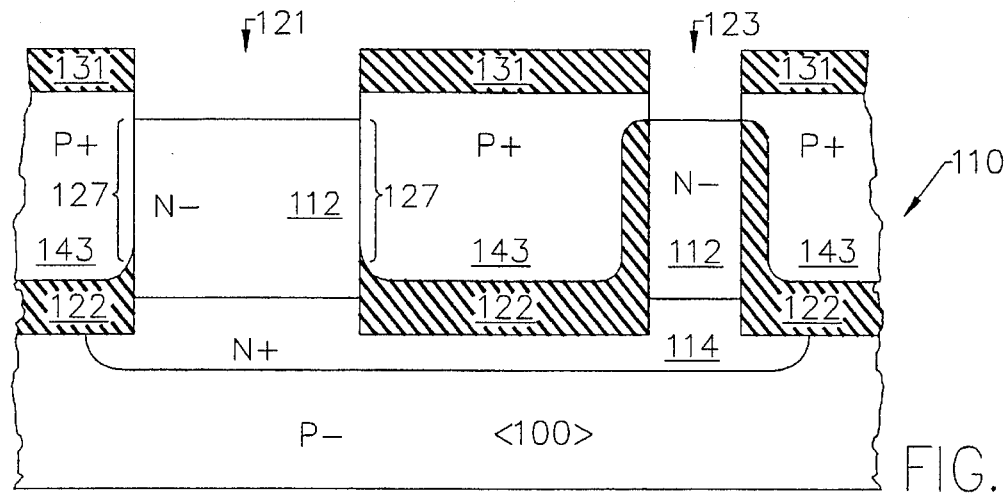

Referring now to FIGS. 4I–4J, the nitride spacers 129 are then stripped and then a protective layer 131, such as a 3000 Å SiO$_2$ layer, is formed (e.g., grown) over the semiconducting regions 126. This protective layer forming step is then followed by the steps of stripping the nitride layers 118, preferably using hot phosphoric acid, and then etching the underlying stress relief SiO$_2$ layers 116 with BHF, as illustrated by FIG. 4J.

Figure 4K:
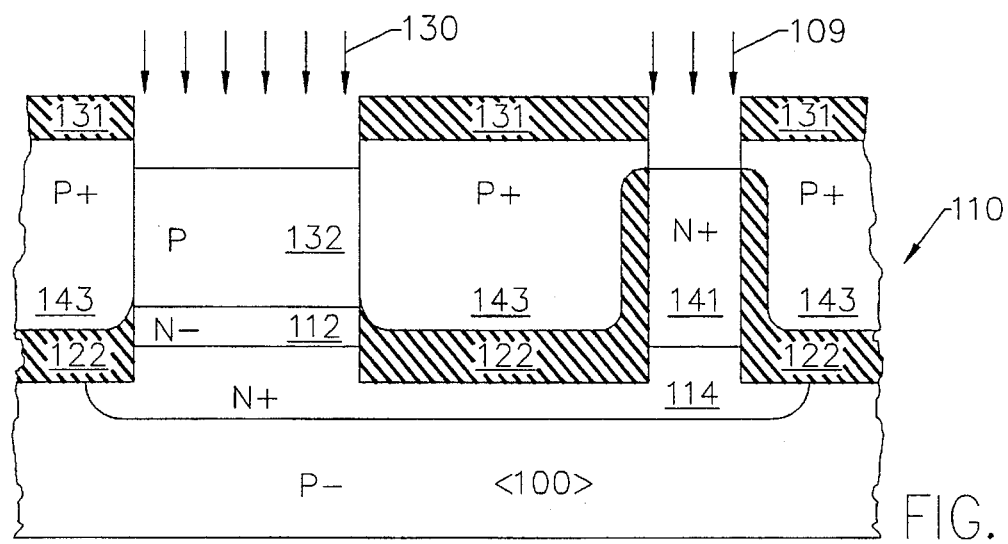
Figure 4L:
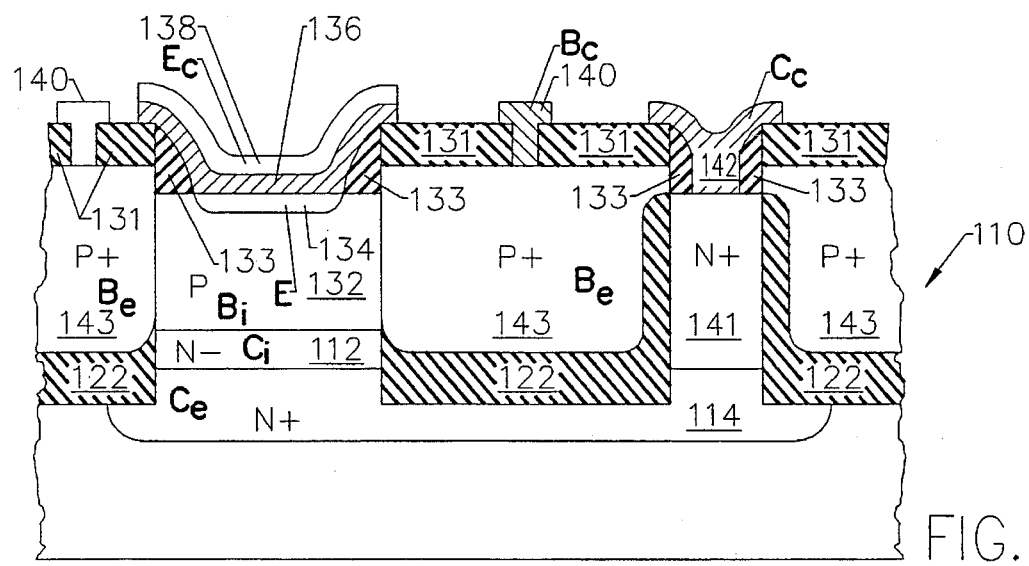

Referring now to FIG. 4K, a P-type dopant implant 130 step and drive-in step are then performed to form a P-type intrinsic base region 132 in the intrinsic collector mesa 121. An N-type dopant implant 109 step and drive-in step are also performed to define an N+ extrinsic collector contact region 141 in the collector contact mesa 123. These steps are then followed by the steps of forming polysilicon sidewall spacers 133 (which are oxidized) on the intrinsic base region 132 and then forming a self-aligned N-type polysilicon emitter layer 136 and N-type emitter region 134 in the opening defined by the insulating spacers 133, as illustrated by FIG. 4L. An ohmic emitter contact 138 (E$_c$), base contact 140 (B$_c$) and collector contact 142 (C$_c$) are then formed on the polysilicon emitter layer 136, monocrystalline extrinsic base region 143 and the monocrystalline extrinsic collector contact region 141, respectively.

Accordingly, the preferred BJT according to the present invention includes: a monocrystalline extrinsic collector (C$_e$) (regions 114, 141); a monocrystalline intrinsic collector region (C$_i$) (region 112); a monocrystalline intrinsic base region (B$_i$) (region 132); a monocrystalline extrinsic base region (B$_e$) (region 143) on a trench insulating layer 122; and monocrystalline emitter region (E) (region 134).

It will be understood by those skilled in the art that electronic devices other than the NMOS and BJT embodiments of FIGS. 3L and 4L can be formed in accordance with the present invention. Such electronic devices include those having at least one trench-isolated active region therein formed by growing monocrystalline semiconducting regions from trench sidewalls as described above. Thus, exemplary electronic devices such as those of FIGS. 3L and 4L include: a monocrystalline semiconductor substrate (10, 110); a first monocrystalline semiconducting region (25, 112) of first conductivity type in the semiconductor substrate; a first trench in the substrate (24, 120); a first trench insulating layer (30, 122) at a bottom of the first trench and on a sidewall thereof; a second monocrystalline semiconducting region of second conductivity type (32, 143) on the first trench insulating layer; a first electronic device active region (C, C$_i$) in the first semiconducting region; and a second electronic device active region (S, B$_e$) in the second semiconducting region. The exemplary electronic devices also include a third electronic device active region (D, E) adjacent the first or second electronic device active region. As illustrated by FIG. 3L, the third electronic device active region can be formed in a third monocyrstalline semiconducting region 32 and this layer is preferably formed in a second trench and extends on a second trench insulating layer.

Figure 5M:
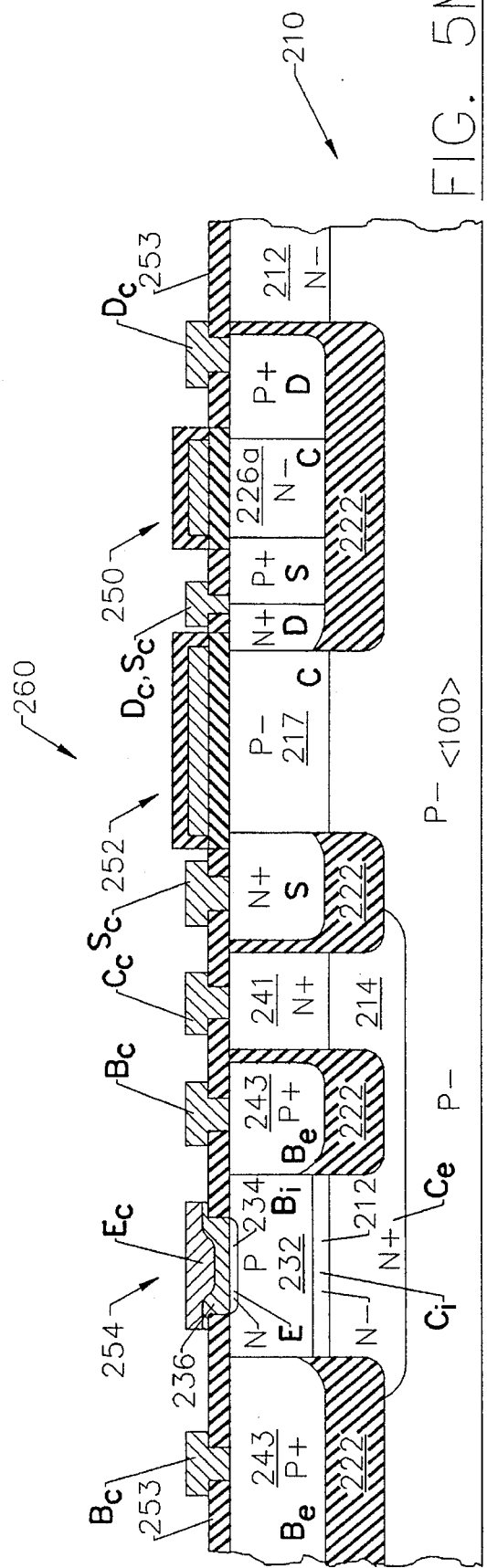

Referring now to FIGS. 5A–5M, a method of forming an electronic device according to a third embodiment of the present invention is illustrated. In particular, FIGS. 5A–5M illustrate the steps of forming a BiCMOS cell which has a bipolar junction transistor (BJT) and complementary N- and P-channel field effect transistors (FETs) therein. These steps are generally compatible with the steps illustrated and described by FIGS. 3A–3L and FIGS. 4A–4L and the accompanying descriptions. Referring specifically to FIG. 5A, an exemplary <100> oriented monocrystalline silicon substrate 210 (shown as P–) is illustrated having a lightly doped epitaxial layer 212 (shown as N–) thereon. A relatively highly doped buried layer 214 (shown as N+) is also provided in the substrate 210, as illustrated. A stress relief layer 216 is then formed on the substrate 210, at a face 210a thereof. The stress relief layer 216 is preferably a 900 Å thick layer of grown $SiO_2$. A nitride layer 218 such as $Si_3N_4$ is also preferably formed on the stress relief layer 216 by LPCVD. The thickness of the nitride layer 218 is preferably 2,000 Å. This is followed by the formation and patterning of a masking layer 219 such as photoresist on the nitride layer 218 using techniques well-known to those skilled in the art. As described more fully hereinbelow, the masking layer 219 is patterned to define an intrinsic collector mesa and an extrinsic collector contact mesa of a BJT and a channel region mesa of an adjacent N-channel field effect transistor.

Referring now to FIG. 5B, the nitride layer 218, the stress relief layer 216 and the epitaxial layer 212 are then anisotropically etched in the exposed area 219a. In particular, dry etching with $SF_6$ is preferably perforated to remove the nitride layer 218 in the exposed areas 219a and then Freon 115 is used to remove the stress relief layer 216 and the epitaxial layer 212. The masking layer 219 is then removed. These steps define a plurality of adjacent trenches 220 in the substrate, as illustrated. The adjacent trenches 220 also define an intrinsic collector mesa 221, a collector contact mesa 223 and a channel region mesa 211 therebetween. The mesas (211, 221 and 223) extend in a third dimension orthogonal to the illustrated cross-section and are preferably of stripe or similar geometry.

In order to selectively form trench insulating layers 222 such as $SiO_2$ which are relatively thick at the bottoms of the trenches 220 but relatively thin along the sidewalls of the trenches, thin spacers 213 are preferably formed adjacent sidewalls of the trenches to inhibit $SiO_2$ growth thereon, as described above with reference to FIG. 3E. These spacers 213 are preferably nitride spacers such as $Si_3N_4$ which have a thickness of about 1000 Å. Referring now to FIG. 5C, wet oxidation of the structure of FIG. 5B is preferably performed to grow the trench insulating layers 222. The thin nitride spacers 213 are also removed by etching with phosphoric acid, however this step is of relatively short duration so that only the top surface of the nitride layer 218 is removed. Then a thin oxide is grown on the sidewalls.

Referring now to FIG. 5D, a non-critical lithographic step using photoresist as a mask 225 is then preferably performed to protect the $SiO_2$ on the sidewalls of the extrinsic collector contact mesa 223 and other regions where sidewall insulation is needed. A solution of BHF is then preferably used to etch back the insulating layers 222 and expose the sidewalls of the intrinsic collector mesa 221 and the channel region mesa 211, but not the bottoms of the trenches 220. As illustrated by FIG. 5E, the photoresist mask 225 is then removed. A plurality of monocrystalline silicon layers 226 are then formed from the uppermost and exposed portions of the sidewalls (shown as windows 227) onto the trench insulating layers 222. Preferably, this step includes the step of growing monocrystalline silicon from the windows 227 using vertically-seeded epitaxial lateral overgrowth (VELO) until the trenches 220 are filled. The semiconducting regions 226 are then chemically/mechanically planarized using the nitride layers 218 as a planarizing/etch stop. A photolithographic step requiring non-critical alignment is then performed to pattern a first implant masking layer 224a on the semiconducting regions 226, as illustrated. A heavy dose, blanket P+ implant 228a such as boron (B) is then used to dope some of the monocrystalline silicon layers 226 and form P+ monocrystalline extrinsic base regions 243 of a bipolar junction transistor therefrom, while the intrinsic collector mesa 221 and the extrinsic collector contact mesa 223 are protected by the self-aligned nitride layers 218.

Another noncritical photolithographic step is then performed to pattern a second implant masking layer 224b on the P+ extrinsic base regions 243, as illustrated by FIG. 5F. Then, a light dose, blanket implant 228b such as phosphorus is performed to dope the remaining monocrystalline silicon layers 226 as N-layers 226a. As illustrated by FIG. 5G, the nitride layers 218 are then stripped preferably in hot phosphoric acid and then the underlying stress relief layers 216 are stripped with BHF to expose the intrinsic collector mesa 221, the extrinsic collector contact mesa 223 and the channel region mesa 211 for further processing. This etching step is then followed by the steps of implanting and driving-in a P-type dopant 228c to form an intrinsic base region 232 in the intrinsic collector mesa 221; implanting and driving-in a high dose N-type dopant 228d to form an N+ extrinsic collector contact region 241 in the collector contact mesa 223; and implanting and driving-in a light dose P-type dopant 228e to form a channel region 217 (shown as P−) in the channel region mesa 211.

Referring now to FIG. 5H, chemical/mechanical planarization of the P+ extrinsic base regions 243 and the N− layers 226a is then performed and followed by the formation of a blanket insulating layer 208 and blanket conductive layer 209 on the substrate 210. The insulating layer 208 is preferably $SiO_2$ formed by conventional deposition or dry oxidation techniques. The thickness of the insulating layer 208 is preferably in the range of about 15 to 50 Å. The conductive layer 209 is preferably poly-Si having a thickness of about 3500 Å and may be deposited using Low Pressure Chemical Vapor Deposition (LPCVD). A masking layer 207 such as photoresist is then formed and patterned as illustrated. The insulating layer 208 and conductive layer 209 are then chemically etched in the exposed areas 207a and this step is preferably followed by the step of oxidizing the top and exposed ends of the etched conductive layer 209 to define first and second insulated gate electrodes 209a–b having surrounding insulating regions 208a–b, as illustrated by FIG. 5I.

Referring now to FIGS. 5J–5K, another noncritical photolithographic step is then performed to pattern a third implant masking layer 224c and this is then followed by a P+ implant 228f and drive-in step using a dopant such as boron (B) to define the source (S), drain (D) and channel (C) regions of the PMOS field effect transistor 250. A fourth implant masking layer 224d is then formed and followed by a N+ implant 228g using a dopant such as phosphorus to define source (S), drain (D) and channel (C) regions of the NMOS field effect transistor 252.

As illustrated by FIG. 5L, a surface insulating layer 253 such as $SiO_2$ having a thickness in the range of about 15 to 50 Å is then formed on the exposed portions of the substrate 210. Then, using techniques known to those skilled in the art, openings are made in the surface insulating layer 253 to expose: the extrinsic base region 243, the intrinsic base region 232 and the extrinsic collector contact region 241 of the BJT; and the source (S) and drain (D) regions of the NMOS FET 252 and PMOS FET 250. As described above with respect to FIG. 4L, an N-type polysilicon emitter layer 236 and an N-type emitter region 234 are then defined adjacent the intrinsic base region 232. As illustrated by FIG. 5M, these steps are then followed by a contact metallization step over the openings to define base, emitter and collector contacts ($B_c$, $E_c$, $C_c$) of the BJT 254, and the source and drain contacts ($S_c$, $D_c$) of the NMOS FET 252 and PMOS FET 250.

Accordingly, the BiCMOS cell 260 of the present invention includes a monocrystalline semiconductor substrate 210 having a plurality of trenches 220 at a face 210a thereof and a plurality of trench insulating layers 222 on bottoms of the trenches 220. Monocrystalline semiconducting regions are also included in the trenches and they extend on the trench insulating layers. Each of these semiconducting regions includes at least one active region of the BiCMOS cell 260. In particular, a monocrystalline extrinsic base region 243 (B$e$) of the cell's BJT 254 extends in one or more of the insulated trenches, as illustrated by FIG. 5M, and a monocrystalline intrinsic base region 232 (B$_i$) extends in the intrinsic collector mesa 221 and adjacent the extrinsic base region 243. The intrinsic collector region (C$_i$) also extends between the intrinsic base region 232 and the extrinsic collector region (C$_e$) which includes the buried layer 214 and the extrinsic collector contact region 241.

The BiCMOS cell 260 also includes a monocrystalline source region (S) of a first field effect transistor (shown as NMOS FET 252) in an adjacent trench and a monocrystalline drain region (D) of the NMOS FET 252 in another adjacent trench. The channel region 217 (C) of the NMOS FET 252 is also provided in the channel region mesa 211, between the source (S) and drain (D). As further illustrated by FIG. 5M, the source (S), drain (D) and channel (C) regions of a second field effect transistor (shown as PMOS FET 250) are also preferably provided in the same trench as the drain (D) of the NMOS FET 252. As will be understood by those skilled in the art, the BJT 254 and the NMOS FET 252 of the BiCMOS cell 260 can comprise the BJT of FIG. 4L and the FET of FIG. 3L and similar semiconductor electronic devices as well.

The drawings and specification disclose typical preferred embodiments of the present invention and, although specific terms are employed, they are used in a generic and descriptive sense only and not for purposes of limitation, the scope of the invention being set forth in the following claims.

That which is claimed is:

1. A method of forming a semiconductor-on-insulator electronic device in a semiconductor substrate, comprising the steps of:

providing a semiconductor substrate;

forming an insulated gate electrode on a face of the semiconductor substrate; and then etching the semiconductor substrate to define a trench, using the insulated gate electrode as a mask, said trench having a sidewall extending between a bottom thereof and the face;

forming a trench insulating layer on the trench bottom;

growing a monocrystalline semiconducting region from the sidewall onto the trench insulating layer; and forming an electronic device active region in the monocrystalline semiconducting region.

2. The method of claim 1, wherein said insulated gate electrode forming step comprises the steps of:

forming a first gate insulating layer on the face;

forming a conductive layer on the first gate insulating layer; and etching the conductive layer to define a gate electrode.

3. The method of claim 1, wherein said insulated gate electrode forming step comprises the steps of:

forming a first gate insulating layer on the face;

forming a conductive layer on the first gate insulating layer;

etching the conductive layer to define a gate electrode having first and second ends;

forming electrically insulating spacers at the first and second ends of the gate electrode.

4. The method of claim 3, wherein said conductive layer forming step is followed by the step of forming a second gate insulating layer on the conductive layer; and wherein said growing step is followed by the step of planarizing the semiconducting region, while using the second gate insulating layer as a planarizing stop.

5. The method of claim 4, wherein said planarizing step is followed by the steps of:

etching the semiconducting region;

forming a sidewall spacer on the semiconducting region, adjacent the gate electrode; and implanting a dopant of second conductivity type in the semiconducting region, using the sidewall spacer as a mask.

6. The method of claim 1, wherein said semiconductor substrate is of first conductivity type;

wherein said substrate etching step comprises the step of etching the semiconductor substrate at a face thereof to define a pair of adjacent trenches and a mesa therebetween having first and second sidewalls;

wherein said trench insulating layer forming step comprises the steps of forming a first trench insulating layer on a bottom of one of the trenches, adjacent the first sidewall, and forming a second trench insulating layer on a bottom of another of the trenches, adjacent the second sidewall;

wherein said growing step comprises the step of growing a first monocrystalline semiconducting region from the first sidewall onto the first trench insulating layer while simultaneously growing a second monocrystalline semiconducting region from the second sidewall onto the second trench insulating layer; and wherein said electronic device active region forming step comprise the steps of forming a first electronic device active region in the first semiconducting region and forming a second electronic device active region in the second semiconducting region.

7. The method of claim 6, wherein said electronic device active region forming step comprises the steps of forming monocrystalline channel, source and drain regions of a field-effect transistor in the mesa and in the first and second semiconducting regions, respectively.

8. A method of forming a semiconductor-on-insulator electronic device in a semiconductor substrate, comprising the steps of:

providing a semiconductor substrate of first conductivity type having a trench therein at a face, said trench having a sidewall extending between a bottom thereof and the face;

forming a trench insulating layer on the trench bottom;

growing a monocrystalline semiconducting region from the sidewall onto the trench insulating layer;

simultaneously with said growing step, doping the semiconducting region with a dopant of second conductivity type; and forming an electronic device active region in the monocrystalline semiconducting region.

9. A method of forming a semiconductor electronic device in a semiconductor-on-insulator substrate, comprising the steps of:

etching the substrate at a face thereof to define a first trench therein having a first bottom and a first sidewall;

etching the substrate at the face to define a second trench therein having a second bottom and a second sidewall;

forming a first trench insulating layer on the first bottom;

forming a second trench insulating layer on the second bottom;

forming a first monocrystalline semiconducting region from the first sidewall onto the first trench insulating layer;

forming a second monocrystalline semiconducting region from the second sidewall onto the second trench insulating layer;

forming a first active region of the electronic device in the first monocrystalline semiconducting region; and forming a second active region of the electronic device in the second monocrystalline semiconducting region, wherein the first trench and second trench define a monocrystalline mesa therebetween and further comprising the step of forming a third active region of the electronic device in the monocrystalline mesa.

10. The method of claim 9, wherein said first trench insulating layer forming step and said second trench insulating layer forming step are performed simultaneously; and wherein said first monocrystalline semiconducting region forming step and said second monocrystalline semiconducting region forming step are performed simultaneously.

11. A method of forming a semiconductor-on-insulator electronic device in a semiconductor substrate, comprising the steps of:

providing a semiconductor substrate having a trench therein, said trench having a sidewall;

forming a trench insulating layer on a bottom of the trench;

growing a monocrystalline semiconducting region from the sidewall onto the trench insulating layer, using epitaxial lateral overgrowth;

forming an active region of the electronic device in the monocrystalline semiconducting region, wherein said semiconductor substrate is of first conductivity type and wherein said growing step includes the step of simultaneously doping the semiconducting region with a dopant of second conductivity type.

* * * * *